(12) United States Patent
Na et al.

(10) Patent No.: US 8,070,199 B2
(45) Date of Patent: Dec. 6, 2011

(54) APPARATUS FOR PICKING UP SEMICONDUCTOR PACKAGE

(75) Inventors: Ik Kyun Na, Incheon (KR); Yong Goo Lee, Incheon (KR); Nho-Kwon Kwak, Incheon (KR)

(73) Assignee: Hanmi Semiconductor, Inc., Incheon (KR)

( * ) Notice: Subject to any disclaimer, the term of this patent is extended or adjusted under 35 U.S.C. 154(b) by 741 days.

(21) Appl. No.: 11/919,024

(22) PCT Filed: Apr. 18, 2006

(86) PCT No.: PCT/KR2006/001436
§ 371 (c)(1),
(2), (4) Date: Oct. 19, 2007

(87) PCT Pub. No.: WO2006/112651
PCT Pub. Date: Oct. 26, 2006

(65) Prior Publication Data
US 2009/0311087 A1 Dec. 17, 2009

(30) Foreign Application Priority Data
Apr. 20, 2005 (KR) .................. 10-2005-0032858

(51) Int. Cl.
*B25J 15/06* (2006.01)
(52) U.S. Cl. .......................... 294/64.1; 294/65

(58) Field of Classification Search ................. 294/64.1, 294/65, 188; 901/40; 269/21; 414/627, 414/737, 752.1
See application file for complete search history.

(56) References Cited

U.S. PATENT DOCUMENTS

| 3,517,958 | A | * | 6/1970 | Boucher et al. ............. 294/64.1 |
| 4,852,247 | A | * | 8/1989 | Hawkswell ................... 29/740 |
| 5,534,073 | A | * | 7/1996 | Kinoshita et al. ............ 118/728 |
| 5,564,682 | A | * | 10/1996 | Tsuji ............................. 269/21 |
| 5,636,887 | A | * | 6/1997 | Petropoulos et al. ........ 294/64.2 |
| 6,032,997 | A | * | 3/2000 | Elliott et al. ................. 294/64.1 |
| 6,272,989 | B1 | * | 8/2001 | Misono et al. ................ 101/474 |

FOREIGN PATENT DOCUMENTS

| JP | 09-148724 | 6/1997 |
| JP | 2004-39736 | 2/2004 |
| JP | 2005-079248 | 3/2005 |

* cited by examiner

*Primary Examiner* — Dean J Kramer
(74) *Attorney, Agent, or Firm* — Sherr & Vaughn, PLLC

(57) ABSTRACT

Disclosed is a semiconductor package pickup apparatus. The apparatus includes a picker base formed with first and second main feeding holes, which are connected to each pneumatic line providing a pneumatic pressure and aligned in a dual-layer structure, and an adsorption pad coupled to a lower portion of the picker base and formed with adsorption holes connected to the first and second main feeding holes. The pneumatic pressure supplied into the first and second main feeding holes is independently controlled, so that the apparatus easily loads or picks up semiconductor packages, even if the size of the semiconductor packages becomes reduced.

8 Claims, 18 Drawing Sheets

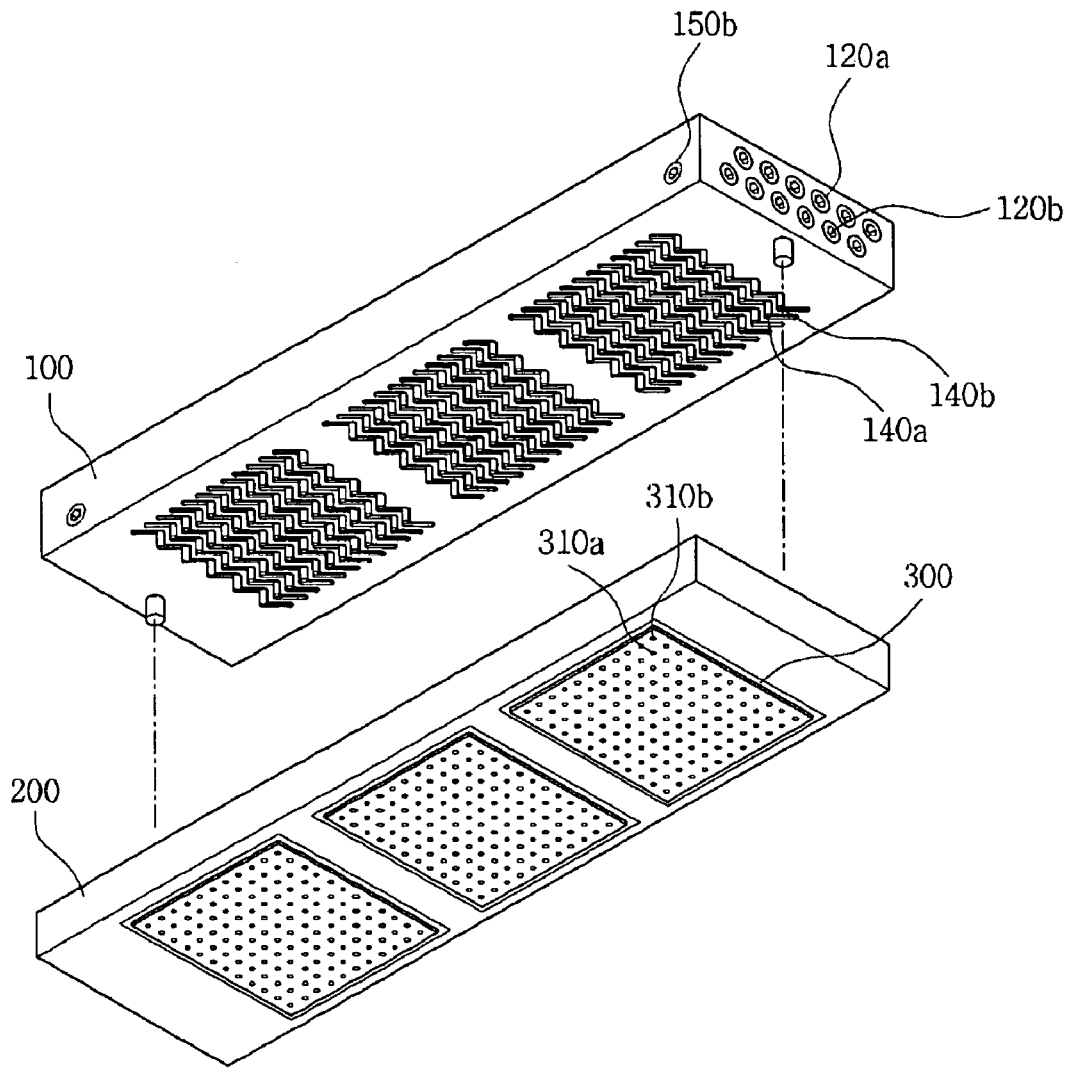
[Fig. 9]
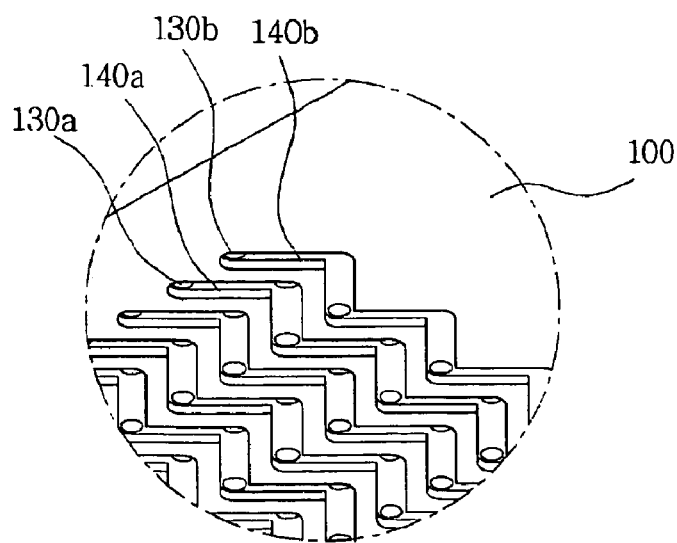
[Fig. 10]

[Fig. 11]
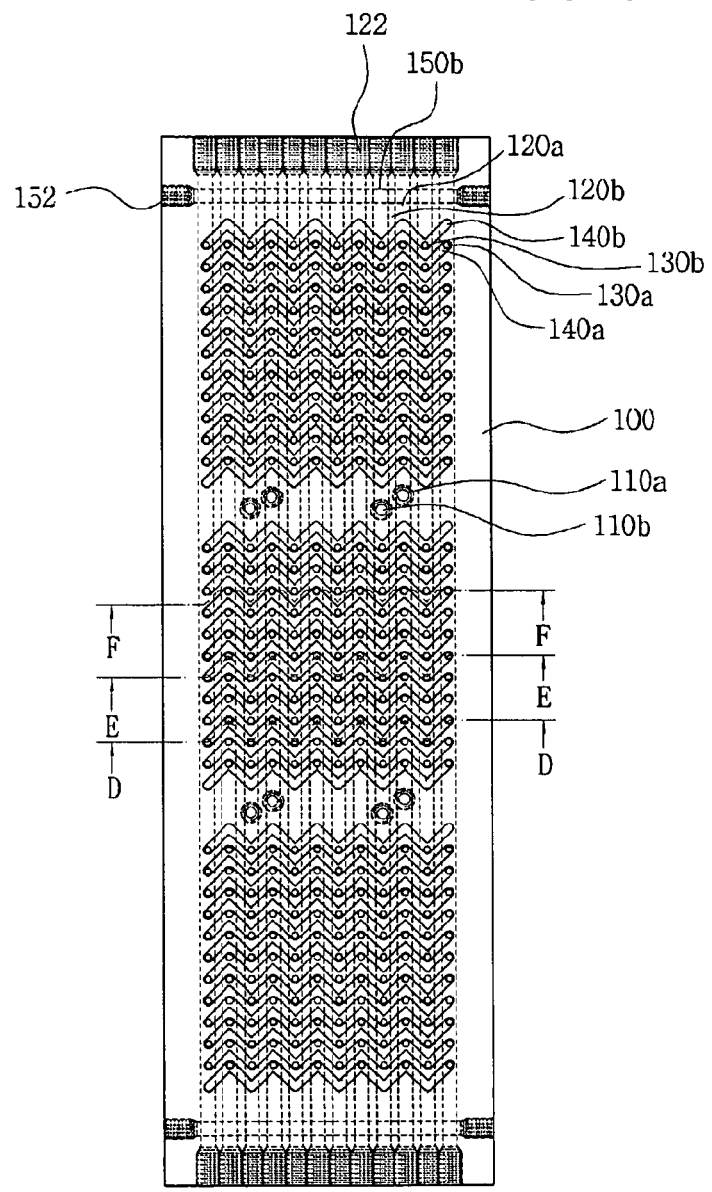
[Fig. 12]
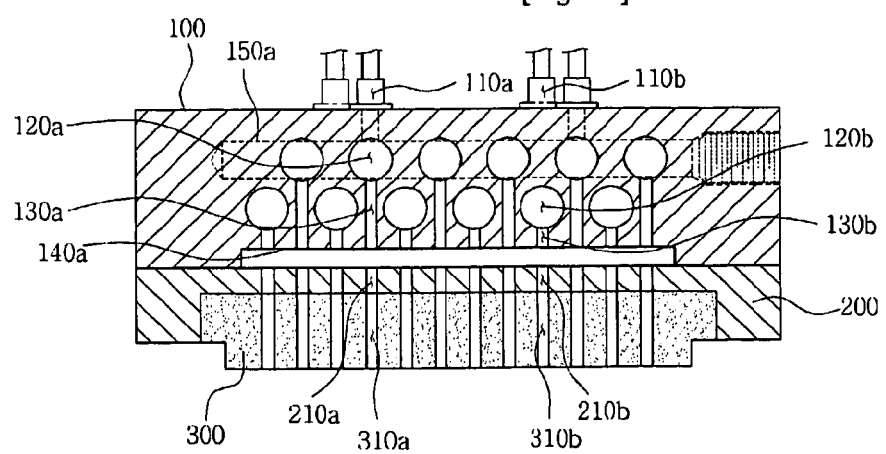

[Fig. 13]
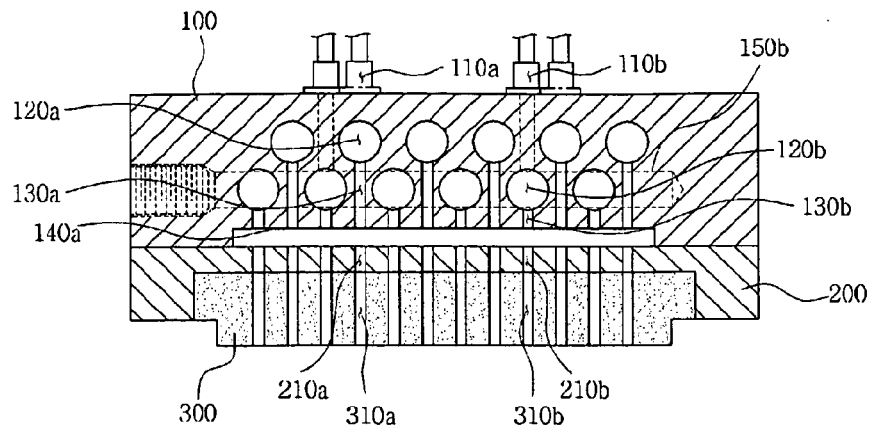
[Fig. 14]
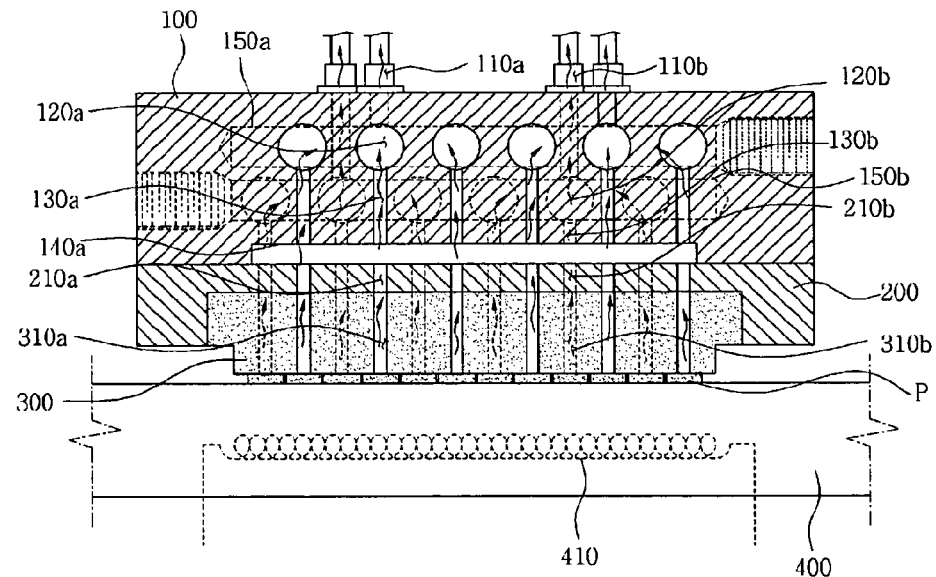
[Fig. 15]
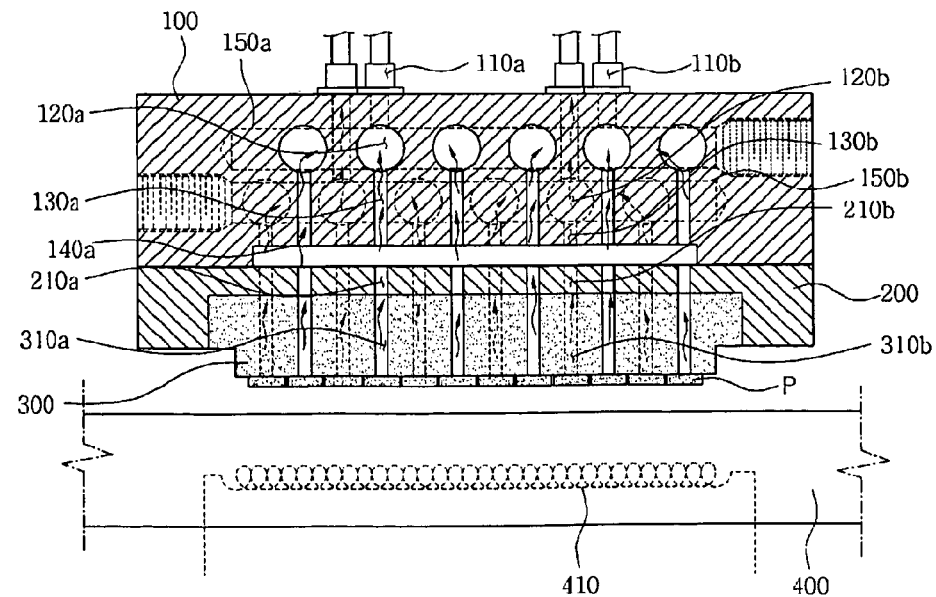

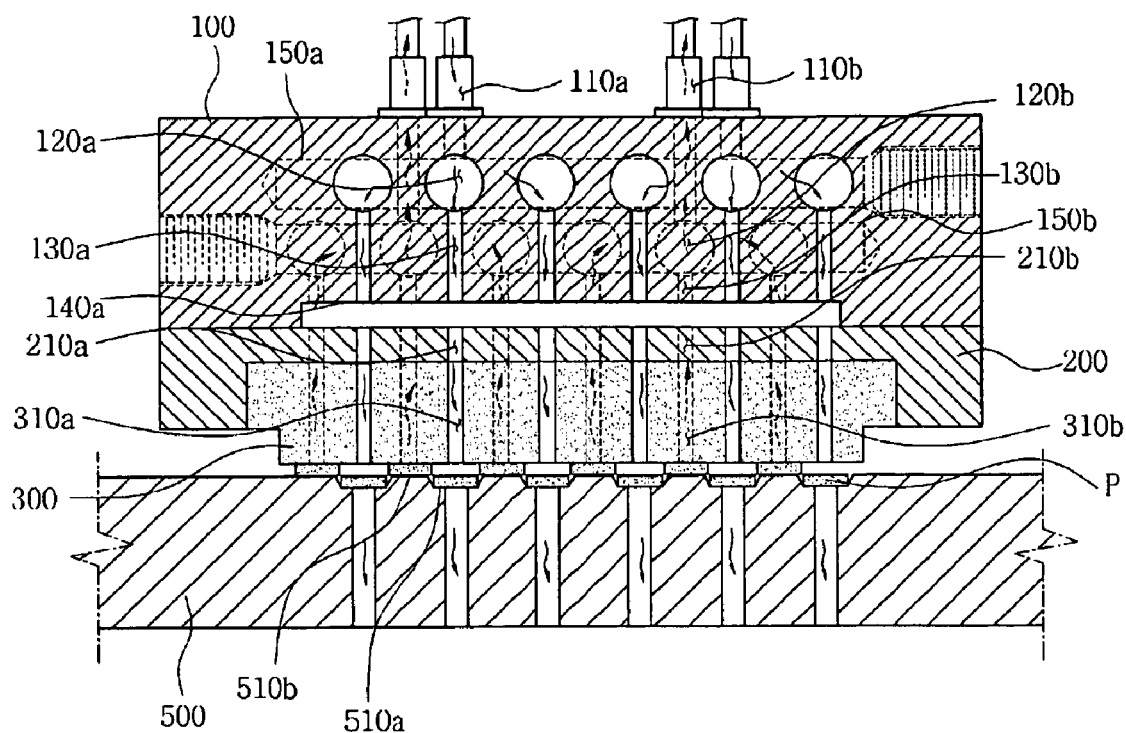
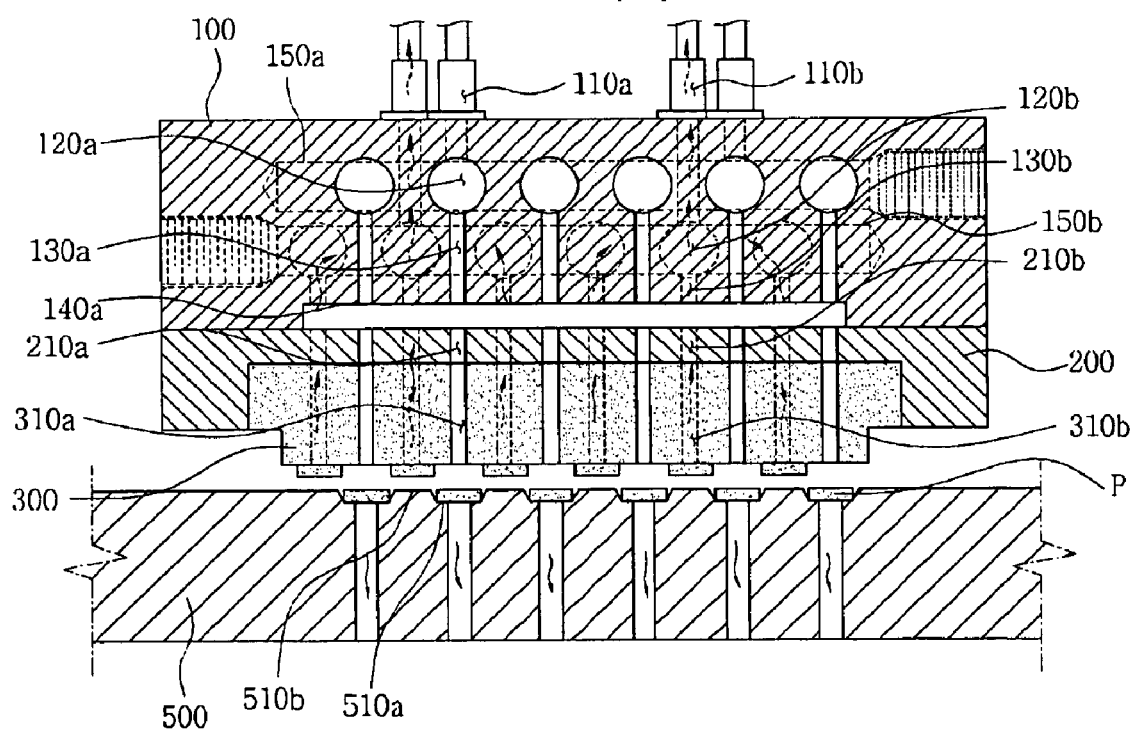

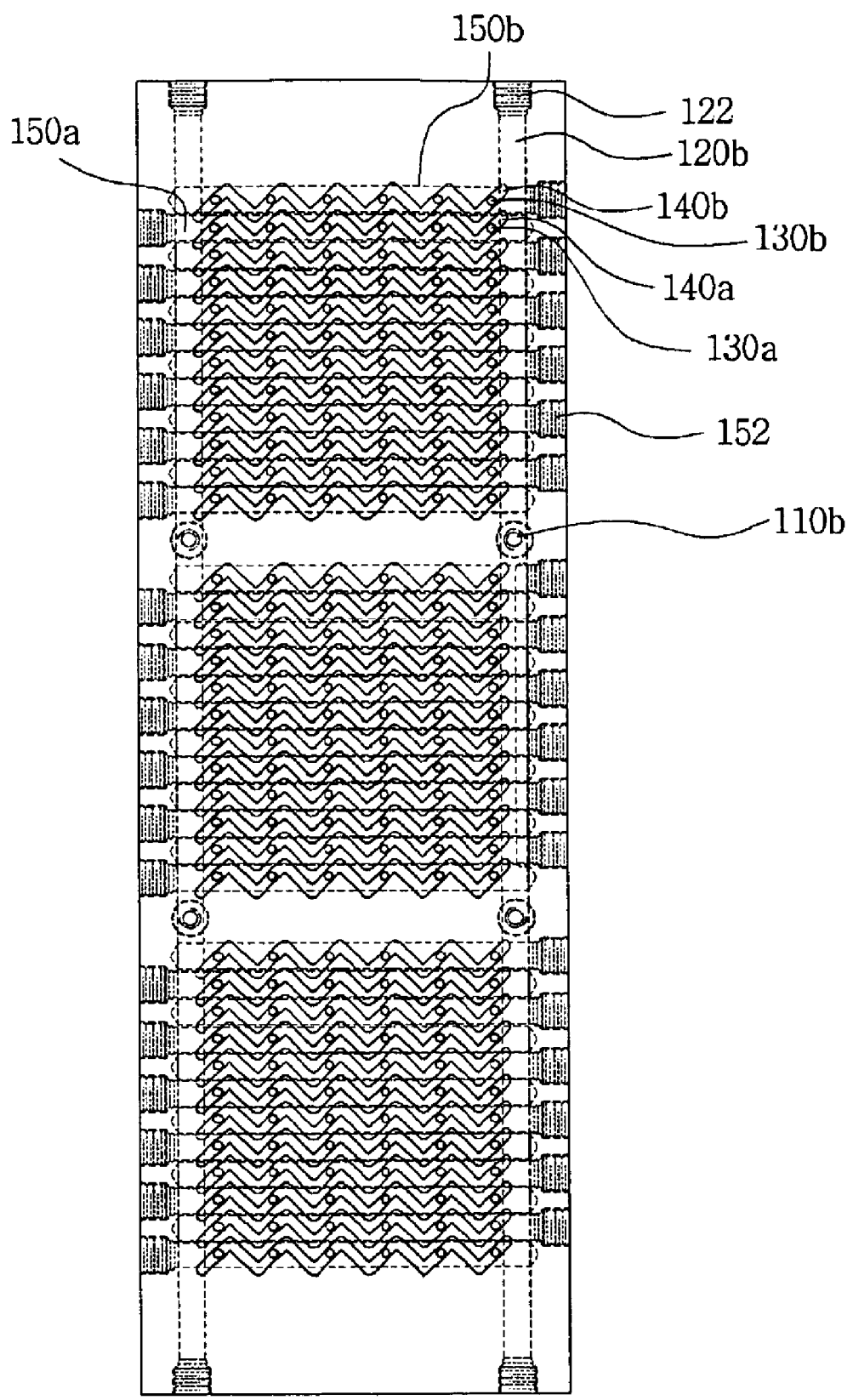
[Fig. 18]

[Fig. 19]
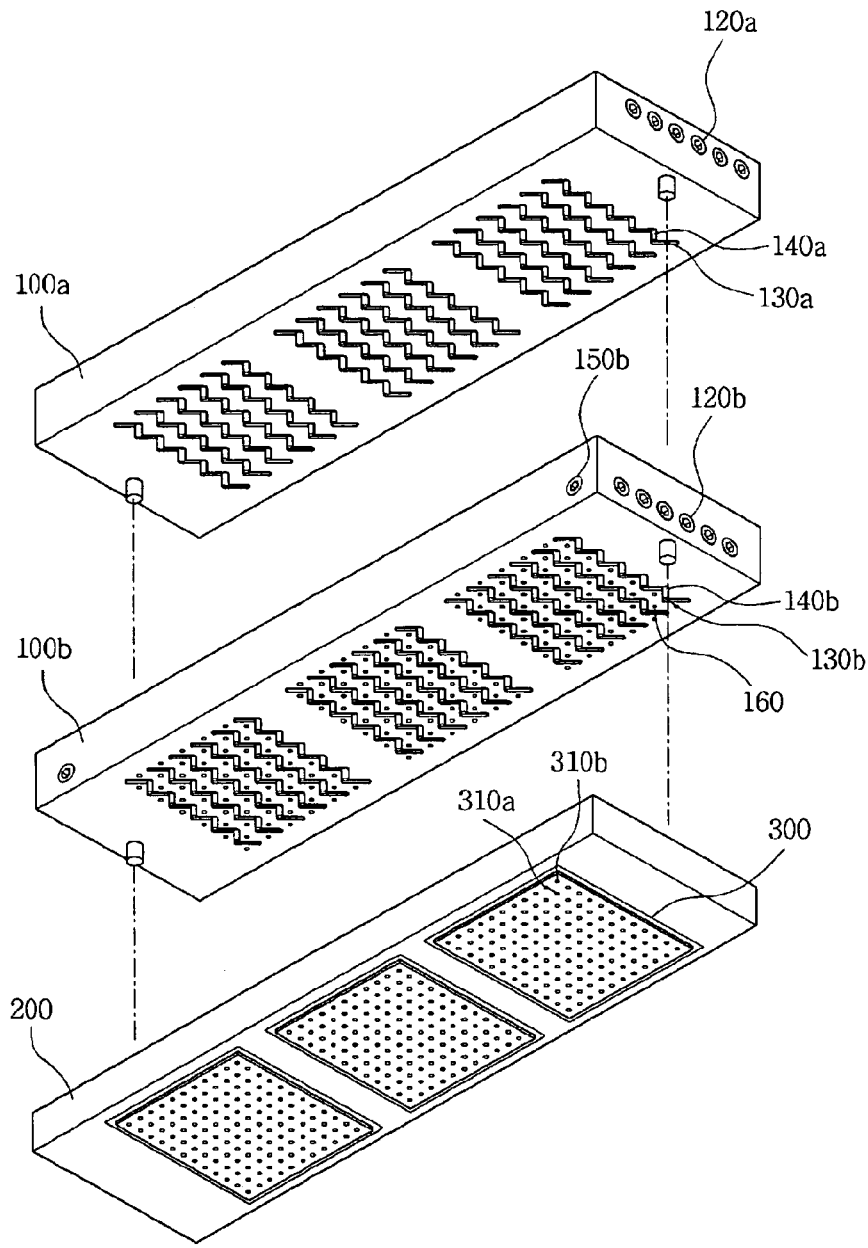
[Fig. 20]
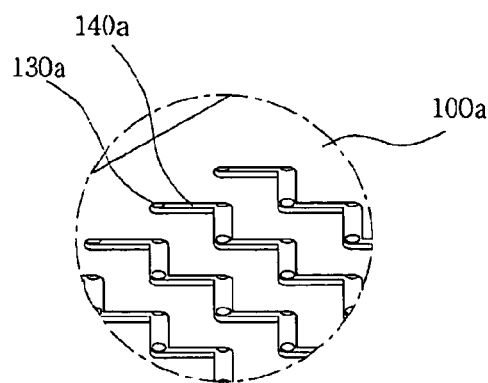

[Fig. 21]
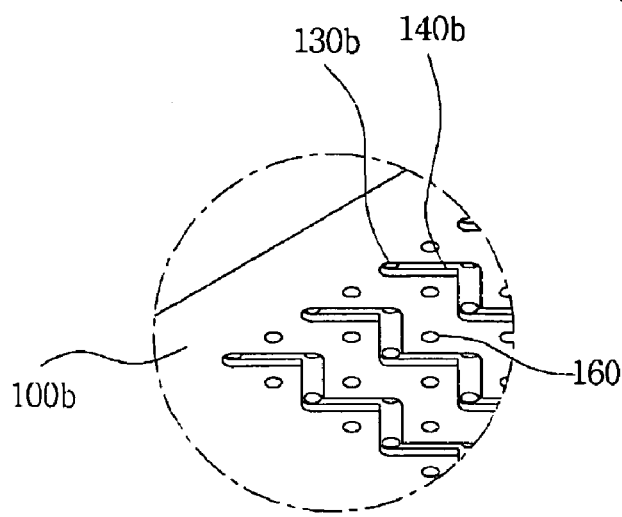
[Fig. 22]
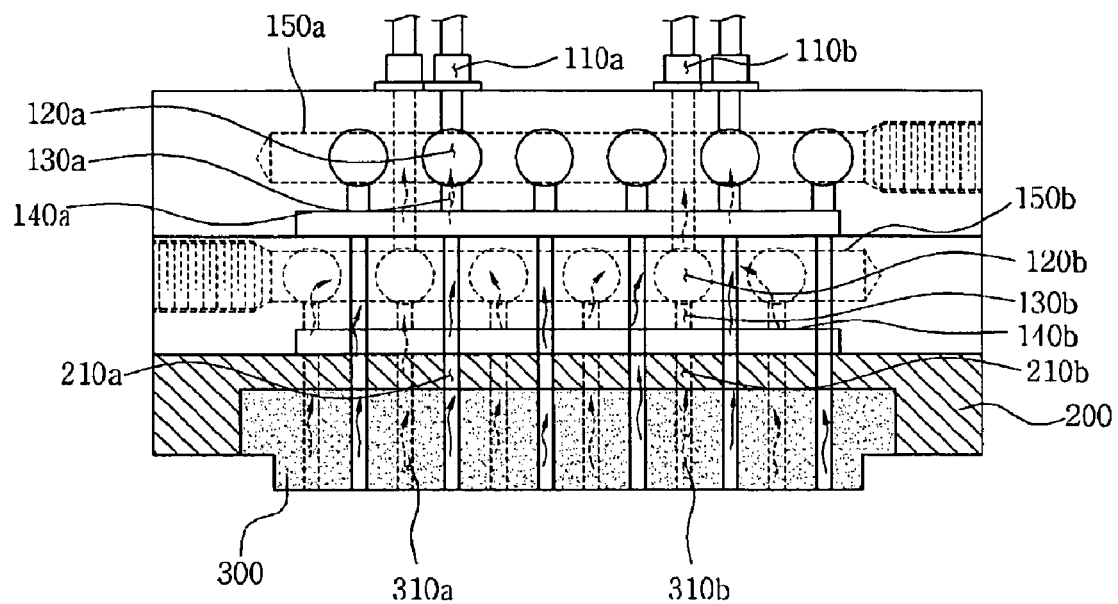

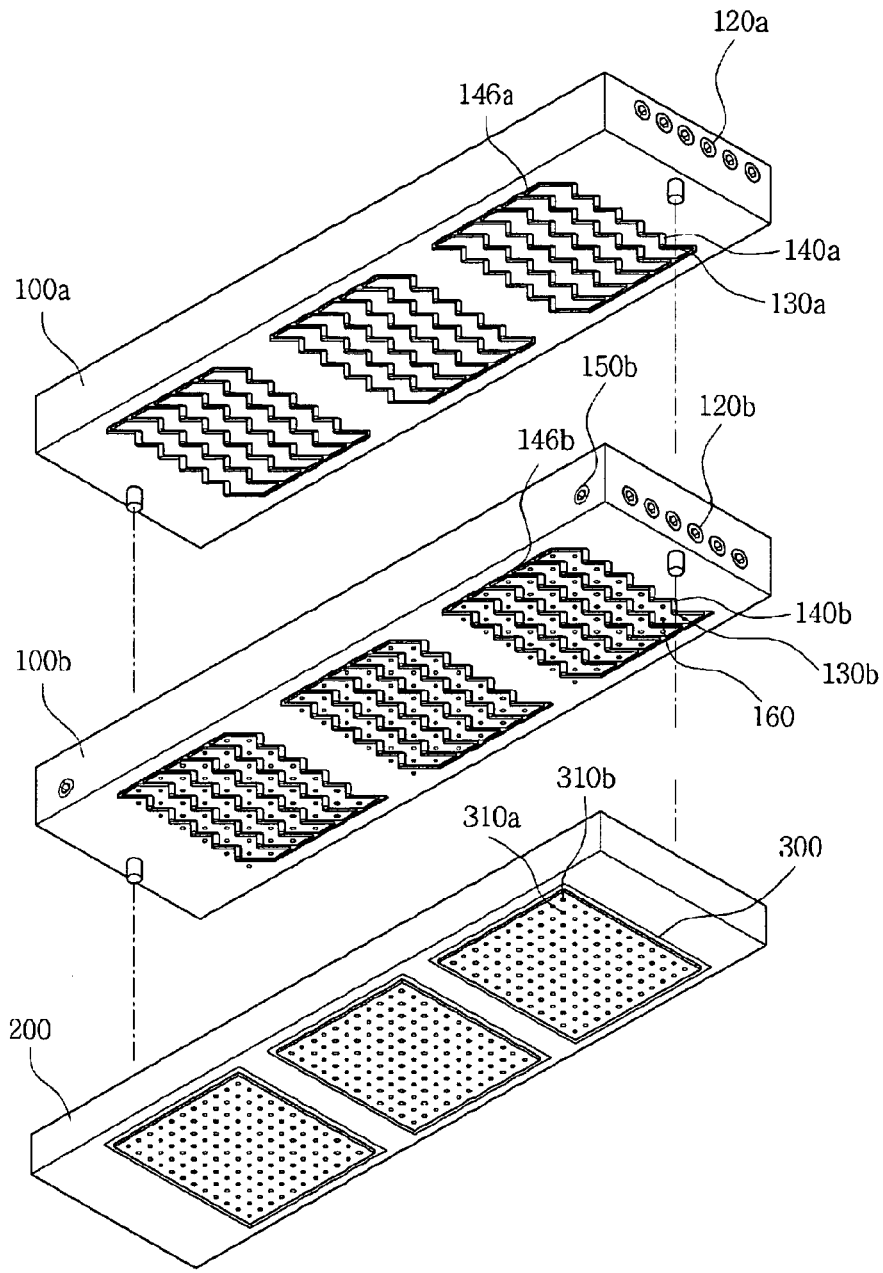
[Fig. 23]
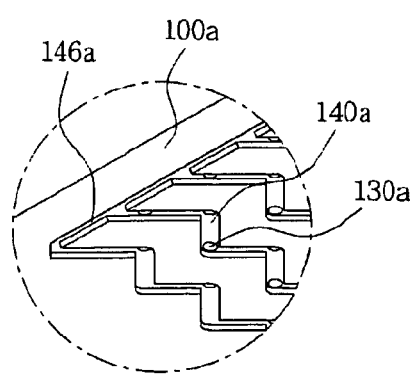
[Fig. 24]

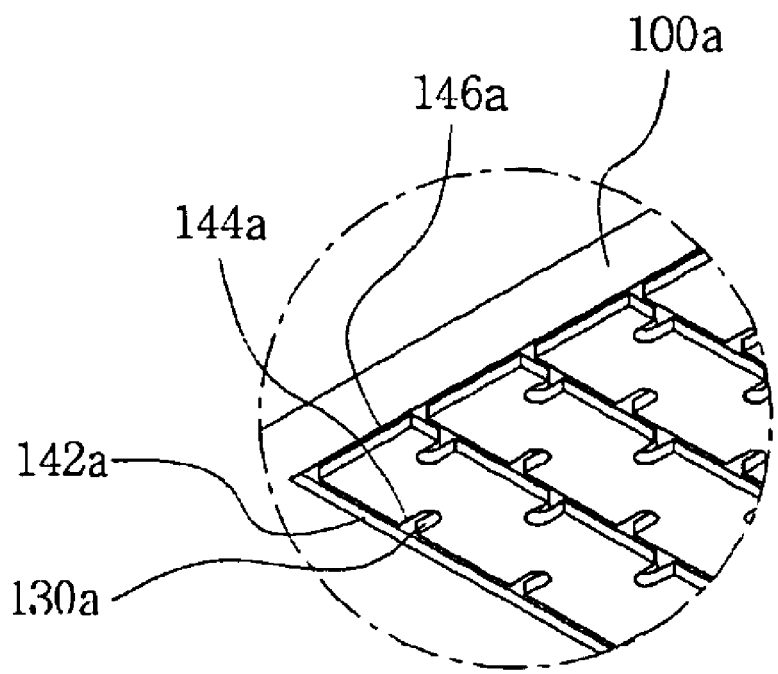
[Fig. 27]
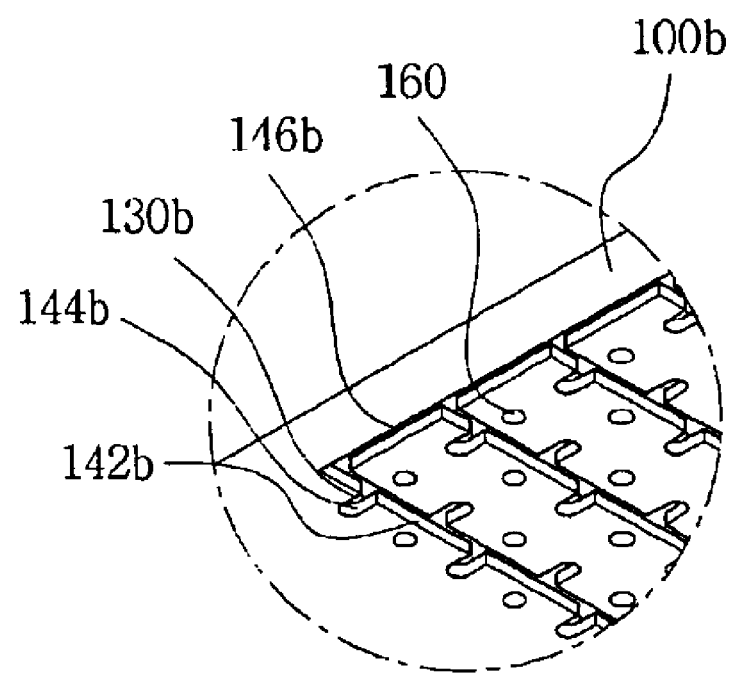
[Fig. 28]

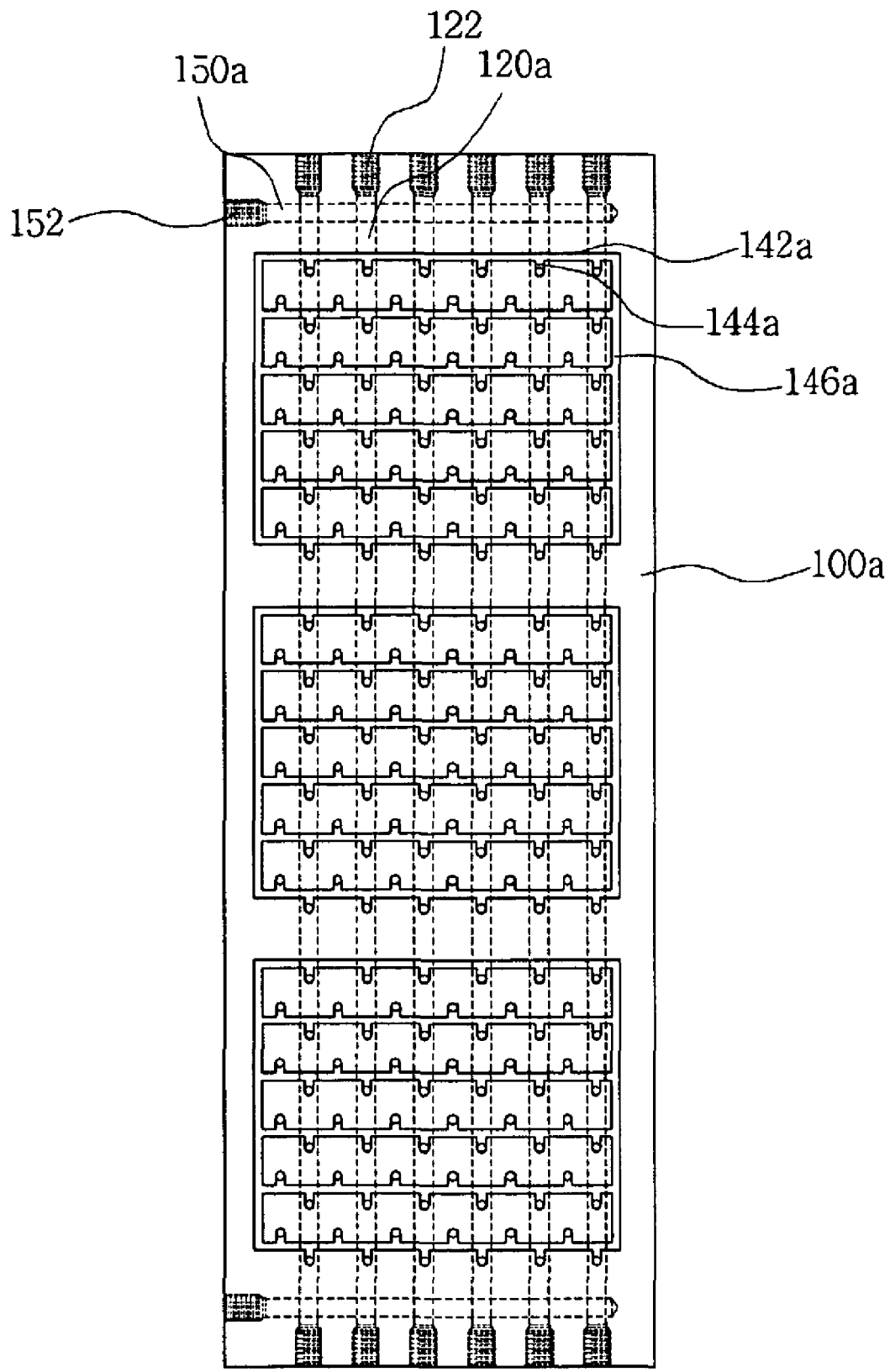
[Fig. 29]

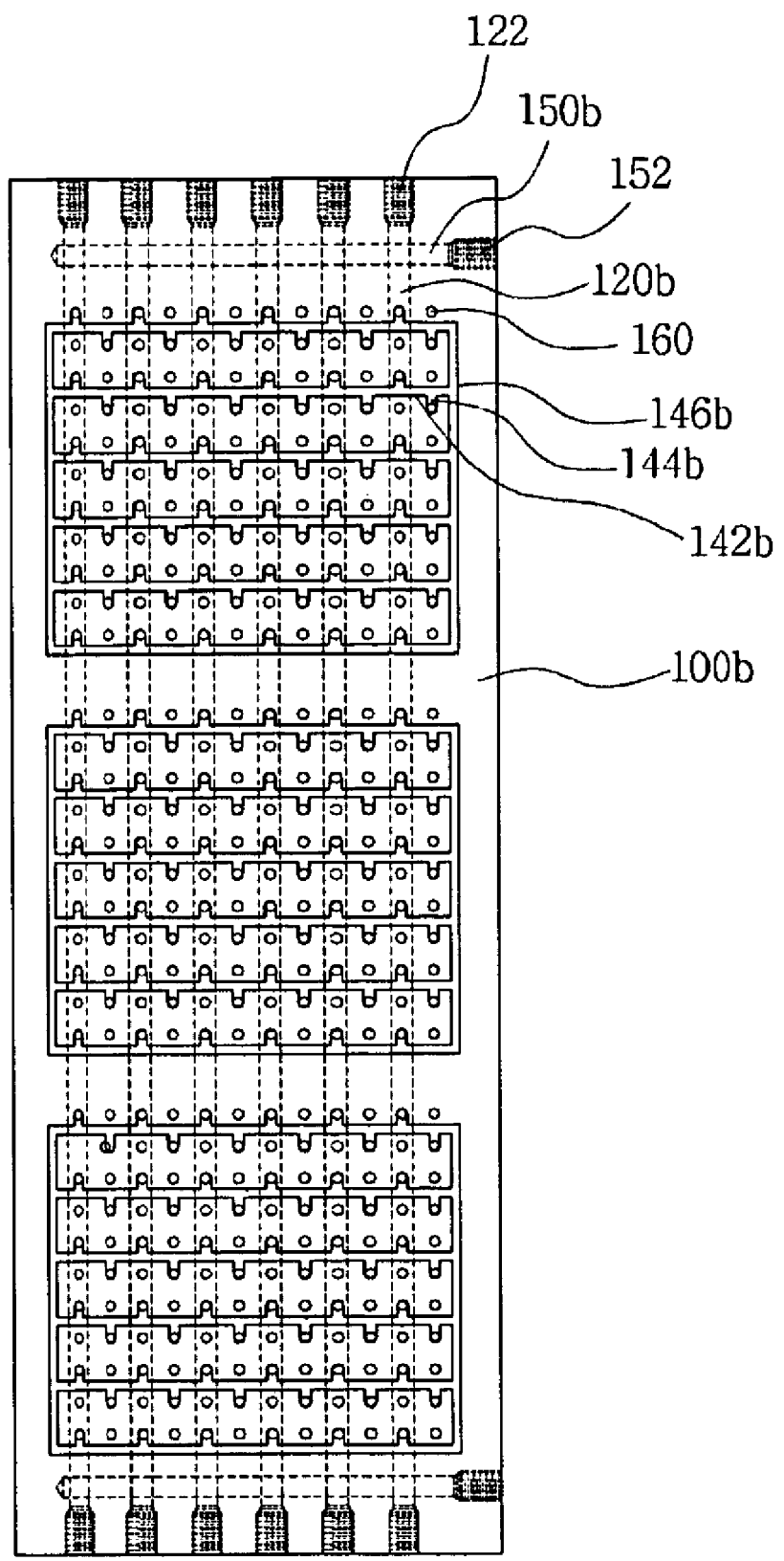
[Fig. 30]

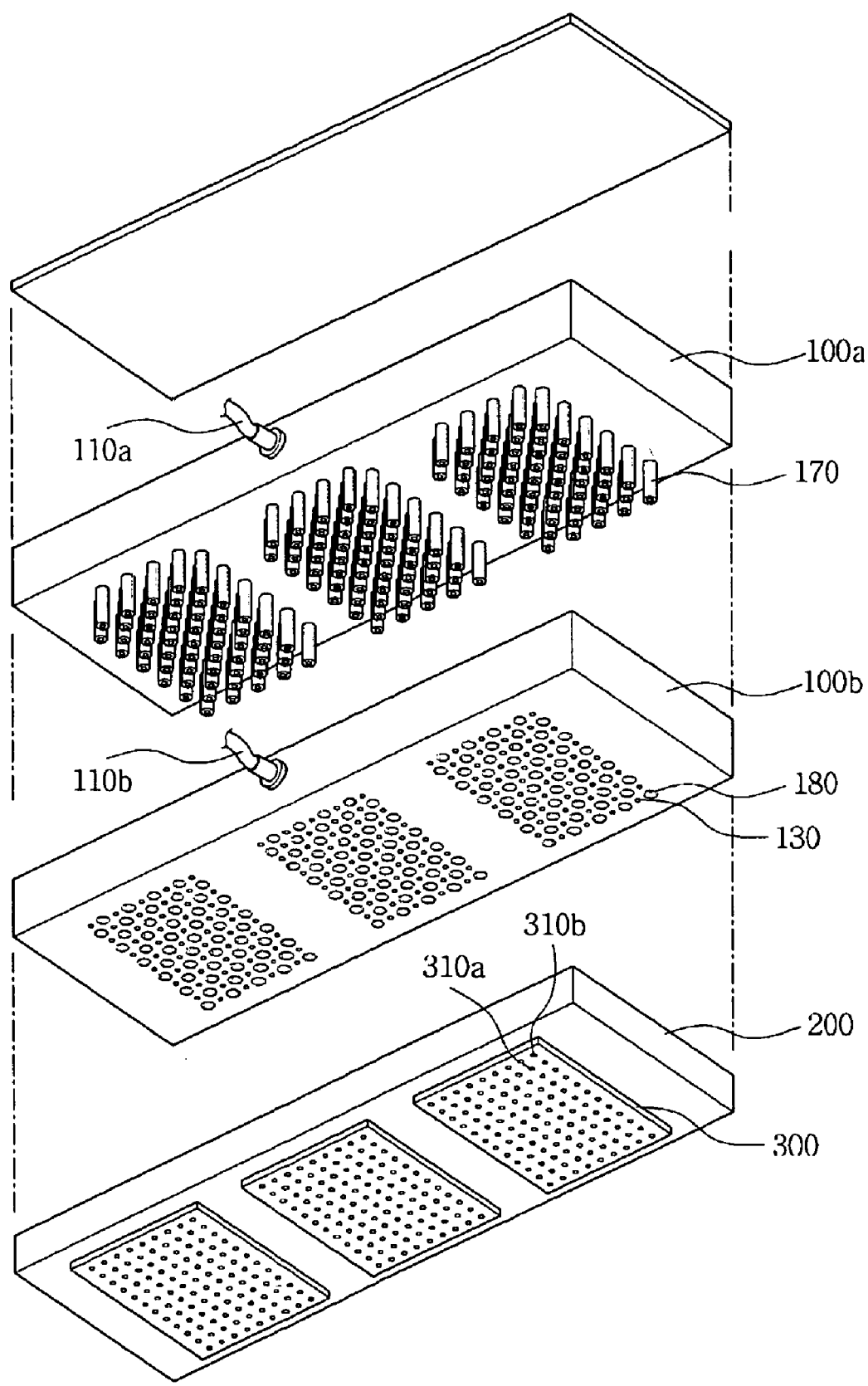
[Fig. 31]

[Fig. 32]
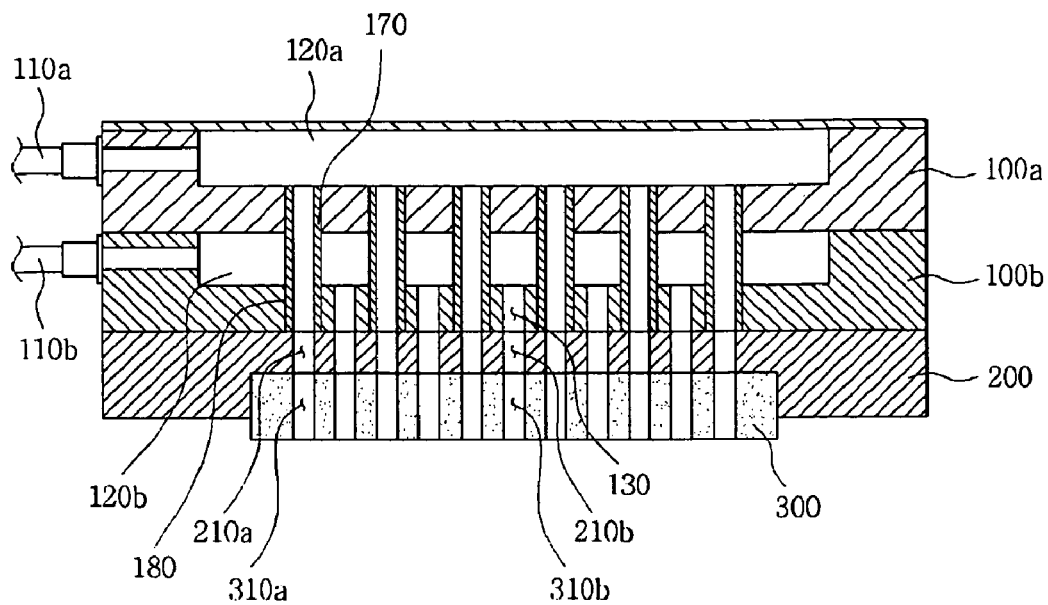
[Fig. 33]
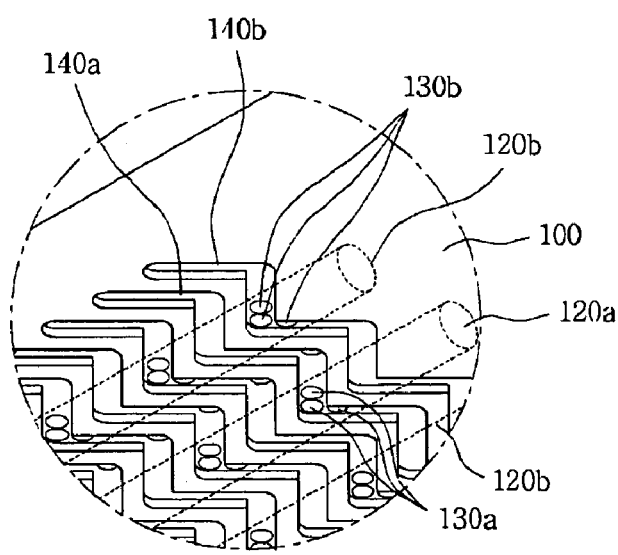
[Fig. 34]
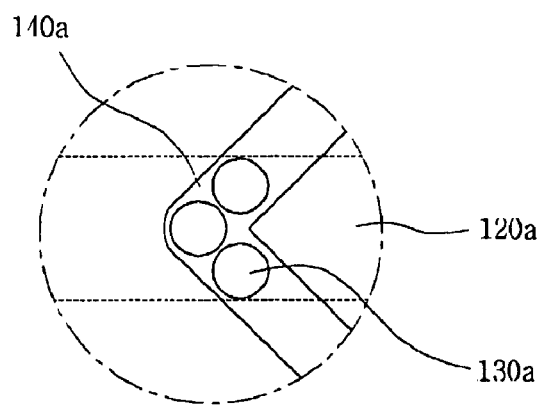

APPARATUS FOR PICKING UP SEMICONDUCTOR PACKAGE

BACKGROUND OF THE INVENTION

1. Field of the Invention

The present invention relates to a semiconductor package pickup apparatus. More particularly, the present invention relates to a semiconductor package pickup apparatus, which picks up individual semiconductor packages in order to transfer the semiconductor packages or loads the semiconductor packages onto a package stacker.

2. Related Prior Art

In general, a semiconductor manufacturing process is mainly divided into a fabrication process and an assembly process. During the fabrication process, integrated circuits are designed on a silicon wafer so as to form a semiconductor chip. In addition, during the assembly process, a semiconductor strip is fabricated by sequentially performing various steps of attaching the semiconductor chip to a lead frame, electrically connecting the semiconductor chip to the lead frame using wires (or solder balls), and molding the semiconductor chip with resin, such as epoxy. Such a semiconductor strip is mounted on a chuck table by means of a strip picker and then transferred to a sawing device, so that the sawing device saws the semiconductor strip into individual packages by using a cutting blade (rotating blade). The individual packages are stacked onto a package stacker after they are washed and dried, and then transferred to a vision inspection device.

Meanwhile, after the drying process has been completed, the semiconductor packages are stacked on first and second stack sections 510 and 520 of the package stacker 500 as shown in FIG. 4. If margin cavities 510b and 520b and stack recesses 510a and 520a are alternately aligned in the first and second stack sections 510 and 520 in order to precisely load the semiconductor packages on the first and second stack sections 510 and 520, the package pickup apparatus simultaneously picks up the semiconductor packages from a drying device 400 and then sequentially loads the semiconductor packages half-and-half onto the first and second stack sections 510 and 520 of the package stacker 500. Such a package stacker 500 is disclosed in Korean Patent Registration No. 0396982, which has been issued to applicant of the present invention, so detailed description for the package stacker will be omitted.

FIGS. 1 to 3 show the conventional package pickup apparatus.

As shown in FIGS. 1 to 3, the conventional package pickup apparatus includes a picker base 100, a pad holder 200 and an adsorption pad 300.

The picker base 100 is formed at an inner portion thereof with first and second main feeding holes 120a and 120b connected to first and second pneumatic lines 110a and 110b, which provide pneumatic pressure. In addition, the picker base 100 is formed at a bottom surface thereof with first and second gull-shaped distribution grooves 140a and 140b, which are alternately aligned corresponding to the stack recesses 510a and 520a formed in the package stacker 500. The picker base 100 is formed at an inner portion thereof with a first transfer hole 130a, which connects the first main feeding hole 120a with the first distribution groove 140a, and a second transfer hole 130b, which connects the second main feeding hole 120b with the second distribution groove 140b. The pad holder 200 is fixed to the bottom surface of the picker base 100 in order to support the adsorption pad 300. The adsorption pad 300 is formed at a bottom surface thereof with a plurality of adsorption holes 310a and 310b so as to directly absorb the semiconductor packages. In general, the adsorption pad 300 is made from rubber or sponge in order to protect the semiconductor package while enhancing the adsorption force relative to the semiconductor packages.

FIGS. 5 to 8 are sectional views, which are taken along line C-C of FIG. 1 in order to illustrate the operational state of the semiconductor package pickup apparatus.

As shown in FIGS. 5 to 8, the conventional semiconductor package pickup apparatus is controlled in such a manner that pneumatic pressure can be independently fed into adsorption holes 310a and 310b, which are aligned corresponding to the stack recesses 510a and 520a of the first and second stack sections 510 and 520 provided in the package stacker 500, in order to sequentially load the semiconductor packages half-and-half onto the first and second stack sections 510 and 520 of the package stacker 500. That is, when the semiconductor package pickup apparatus picks up the semiconductor packages stacked on the drying device 400, as shown in FIG. 5, vacuum pressure is fed into the first and second main feeding holes 120a and 120b, so that the semiconductor package pickup apparatus can pick up the semiconductor packages. In addition, when the semiconductor package pickup apparatus loads the semiconductor packages onto the first or second stack section 510 or 420 of the package stacker 500, as shown in FIG. 8, pneumatic pressure is fed into the first main feeding hole 120a (or second main feeding hole 120b) so that the semiconductor packages are separated from the semiconductor package pickup apparatus.

SUMMARY OF THE INVENTION

However, according to the conventional semiconductor package pickup apparatus having the above structure, if the size of the semiconductor package is reduced, the gull-shaped distribution grooves 140a and 140b must have a reduced size and must be densely configured when the semiconductor package pickup apparatus picks up the semiconductor packages stacked on the drying device 400 or loads the semiconductor packages onto the first and second stack sections 510 and 520 of the package stacker 500. However, in this case, air resistance may increase when air is fed into the adsorption holes 310a and 310b of the adsorption pad 300 by way of the pneumatic lines 110a and 110b, the main feeding holes 120a and 120b, the transfer holes 130a and 130b, and the distribution grooves 140a and 140b. For this reason, as shown in FIG. 6, semiconductor packages P located away from the first and second pneumatic lines 110a and 110b may not be securely picked up by the adsorption pad. In addition, as shown in FIG. 8, about a half of the semiconductor packages may not be separated from the adsorption pad 300 even though they must be separated from the adsorption pad 300.

In addition, according to the conventional semiconductor package pickup apparatus having the above structure, the first and second main feeding holes 120a and 120b are aligned in the same plane while being offset from each other, so that the pneumatic pressure supplied from the first and second main feeding holes 120a and 120b cannot be effectively fed into the adsorption holes 310a and 310b when the size of the semiconductor package is excessively reduced.

The present invention has been made in view of the above-mentioned problems, and it is an object of the present invention to provide a semiconductor package pickup apparatus capable of securely picking up semiconductor packages and sequentially loading the semiconductor packages onto first and second stack sections of a package stack after the drying process has been completed, even if the semiconductor packages have a small size.

In order to accomplish the above object, according to one aspect of the present invention, there is provided a semiconductor package pickup apparatus comprising: a picker base formed with first and second main feeding holes, which are connected to each pneumatic line providing a pneumatic pressure and aligned in a dual-layer structure; and an adsorption pad coupled to a lower portion of the picker base and formed with adsorption holes connected to the first and second main feeding holes, wherein the pneumatic pressure supplied into the first and second main feeding holes is independently controlled.

A plurality of first and second main feeding holes are uniformly distributed on each plane of the picker base such that the pneumatic pressure can be uniformly transferred to the adsorption holes of the adsorption pad.

The first and second main feeding holes are connected to the adsorption holes of the adsorption pad through first and second transfer holes formed in the picker base, and the first and second transfer holes are alternately aligned such that the first transfer holes do not interfere with the second transfer holes.

First and second distribution grooves are alternately formed at a bottom surface of the picker base so as to be connected to the first and second transfer holes, and the pneumatic pressure supplied through the first and second transfer holes is transferred to the adsorption holes through the first and second distribution grooves.

A plurality of first and second transfer holes are provided in order to connect the first and second main feeding holes with the first and second distribution grooves, respectively.

The picker base is formed at an inner portion thereof with a first connection hole, which is aligned perpendicularly to the first main feeding holes in order to connect the first main feeding holes to each other, and a second connection hole, which is aligned perpendicularly to the second main feeding holes in order to connect the second main feeding holes to each other.

In addition, the first and second main feeding holes include a pair of perforation holes formed lengthwise along the picker base, the picker base has a plurality of first connection holes, which are aligned perpendicularly to the first main feeding holes in order to connect the first main feeding holes to each other, and a plurality of second connection holes, which are aligned perpendicularly to the second main feeding holes in order to connect the second main feeding holes to each other, first and second transfer holes are formed in the picker base such that the first and second transfer holes can be connected to the first and second connection holes, and the picker base is formed at a bottom surface thereof with first and second distribution grooves, which are alternately aligned so as to be connected to the first and second transfer holes.

The picker base includes an upper base formed with a first main feeding hole connected to the pneumatic line and a lower base formed with a second main feeding hole connected to the pneumatic line.

The upper base is formed at an inner portion thereof with a first transfer hole connected to the first main feeding hole, a first distribution groove is formed at a bottom surface of the upper base so as to be connected to the first transfer hole, the lower base is formed at an inner portion thereof with a second transfer hole connected to the second main feeding hole, and a second distribution groove and a third transfer hole are formed at a bottom surface of the lower base such that the second distribution groove and the third transfer hole can be connected to the second transfer hole and the first distribution groove, respectively.

A plurality of first and second distribution grooves are provided while being connected to each other.

A plurality of first and second main feeding holes are provided, the upper base is formed at an inner portion thereof with a first connection hole, which is aligned perpendicularly to the first main feeding holes in order to connect the first main feeding holes to each other, and the lower base is formed at an inner portion thereof with a second connection hole, which is aligned perpendicularly to the second main feeding holes in order to connect the second main feeding holes to each other.

A pad holder formed with first and second perforation holes is coupled to a lower portion of the picker base, and the adsorption pad is coupled to a lower portion of the pad holder.

According to another aspect of the present invention, there is provided a semiconductor package pickup apparatus comprising: an upper base having a first main feeding hole connected to a first pneumatic line and being provided with a vacuum pipe, which protrudes from a bottom surface of the upper base so as to be connected to the first main feeding hole; a lower base coupled to the bottom surface of the upper base, formed with a second main feeding hole connected to a second pneumatic line, and formed at an inner portion thereof with a pipe hole for receiving the vacuum pipe and a transfer hole connected to the second main feeding hole; and an adsorption pad coupled to a lower portion of the lower base and formed with adsorption holes connected to the first and second main feeding holes, wherein the pneumatic pressure supplied into the first and second main feeding holes is independently controlled.

As described above, the semiconductor package pickup apparatus according to the present invention can easily pick up and load the semiconductor packages onto a package stacker even if the semiconductor packages have a small size.

That is, according to the present invention, since main feeding holes are aligned in a dual-layer structure, the main feeding holes can be formed with a large diameter even if the size of the semiconductor package is reduced, so degradation of the adsorption force caused by fluid resistance can be prevented. In addition, since a plurality of main feeding holes and transfer holes are uniformly distributed on each plane of a picker base, the pneumatic pressure can be uniformly transferred to adsorption holes aligned at left and right end portions of the adsorption pad. Thus, the semiconductor package pickup apparatus can securely pick up and load the semiconductor packages even if the semiconductor packages are fabricated with a small size.

In addition, since the transfer holes are formed corresponding to adsorption holes of the adsorption pad in order to transfer the pneumatic pressure from the main feeding holes to the distribution grooves, degradation of the adsorption force caused by fluid resistance can be further prevented.

Thus, the semiconductor package pickup apparatus according to the present invention can easily perform the pickup operation, so that unit per hour (UPH) of a semiconductor package handler system can be significantly improved.

BRIEF DESCRIPTION OF THE DRAWINGS

FIG. 9 is a perspective view illustrating a semiconductor package pickup apparatus according to an exemplary embodiment of the present invention;

FIG. 10 is a partially enlarged view illustrating distribution grooves and transfer holes formed in a semiconductor package pickup apparatus shown in FIG. 9;

FIG. 11 is a bottom view illustrating a picker base of a semiconductor package pickup apparatus shown in FIG. 9;

FIGS. 12 and 13 are sectional views, which are taken along lines D-D and E-E shown in FIG. 11 in order to illustrate a semiconductor package pickup apparatus;

FIGS. 14 to 17 are sectional views taken along line F-F shown in FIG. 11 for illustrating operational states of a semiconductor package pickup apparatus according to the present invention;

FIG. 18 is a bottom view illustrating a picker base of a semiconductor package pickup apparatus according to a second embodiment of the present invention;

FIG. 19 is a perspective view illustrating a semiconductor package pickup apparatus according to a third embodiment of the present invention;

FIGS. 20 and 21 are partially enlarged views illustrating first and second distribution grooves formed in a semiconductor package pickup apparatus shown in FIG. 19;

FIG. 22 is a sectional view illustrating the coupling state of a semiconductor package pickup apparatus shown in FIG. 19;

FIG. 23 is a perspective view illustrating a semiconductor package pickup apparatus according to a fourth embodiment of the present invention;

FIGS. 24 and 25 are partially enlarged views illustrating first and second distribution grooves formed in a semiconductor package pickup apparatus shown in FIG. 23;

FIGS. 27 and 28 are partially enlarged views illustrating first and second distribution grooves formed in a semiconductor package pickup apparatus shown in FIG. 26;

FIGS. 29 and 30 are bottom views illustrating upper and lower bases of a semiconductor package pickup apparatus shown in FIG. 26;

FIG. 31 is a perspective view illustrating a semiconductor package pickup apparatus according to a sixth embodiment of the present invention;

FIG. 32 is a sectional view illustrating a coupling state of a semiconductor package pickup apparatus shown in FIG. 31;

FIG. 33 is a partially enlarged view illustrating first and second distribution grooves formed in a semiconductor package pickup apparatus according to a seventh embodiment of the present invention; and FIG. 34 is a partially enlarged view illustrating alignment between first transfer holes and first main feeding holes formed in first distribution grooves shown in FIG. 33.

DETAILED DESCRIPTION OF THE PREFERRED EMBODIMENTS

Figure 1:
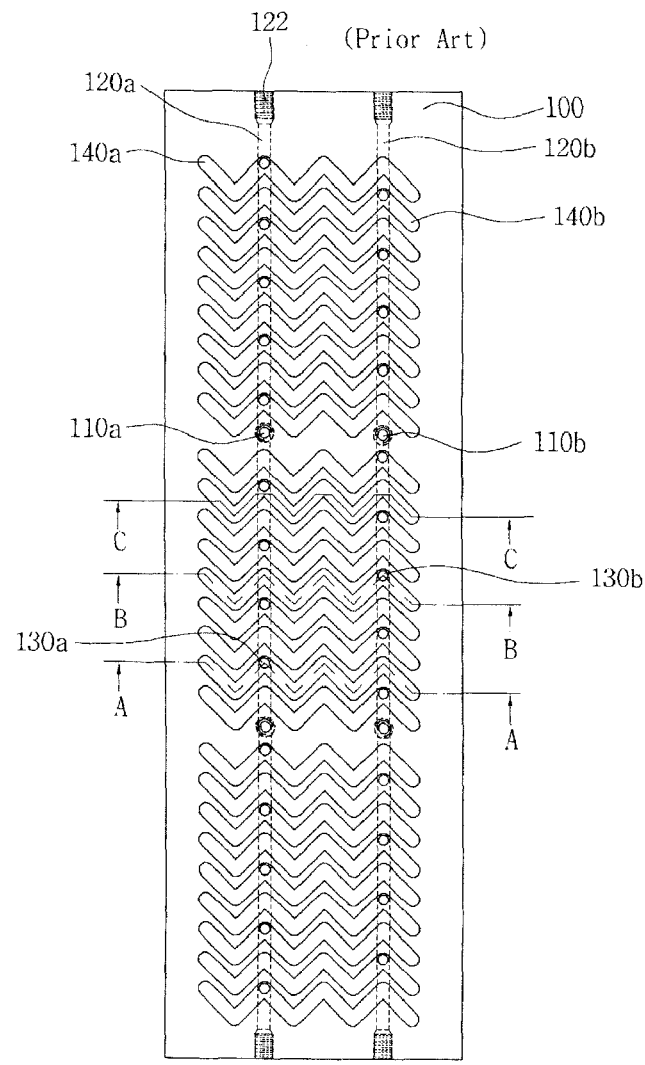
FIG. 1 is a bottom view illustrating a picker base of a conventional semiconductor package pickup apparatus.
Figure 2:
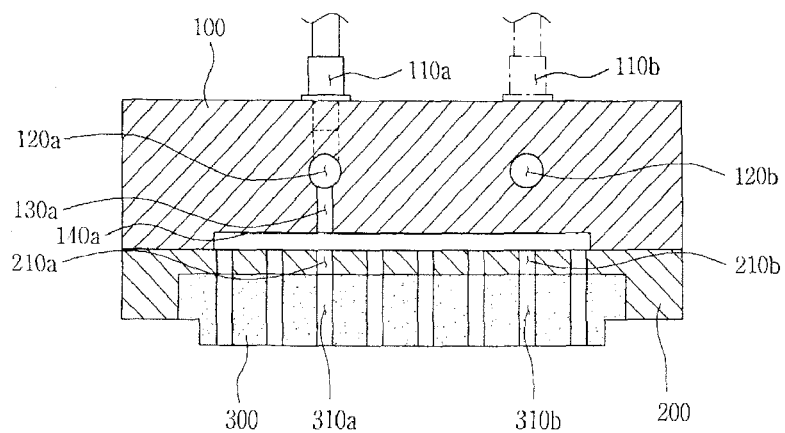
FIGS. 2 and 3 are sectional views taken along lines A-A and B-B shown in FIG. 1, which illustrates a conventional semiconductor package pickup apparatus.
Figure 3:
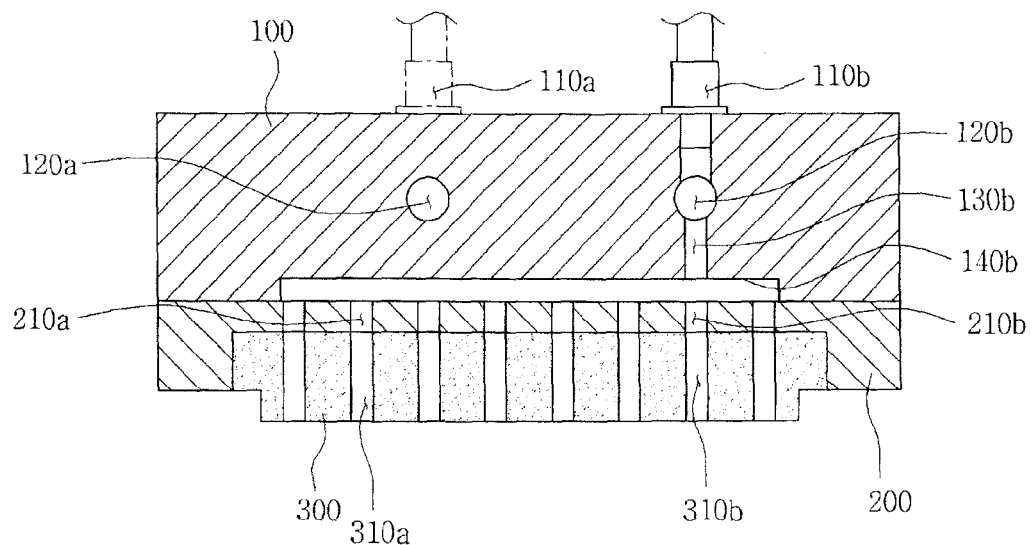
Figure 4:
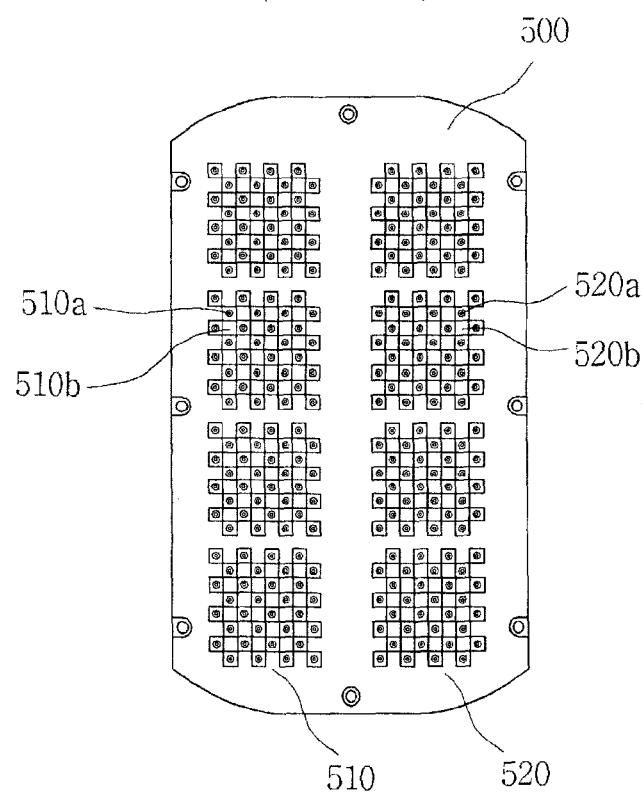
FIG. 4 is a plan view illustrating a conventional semiconductor package pickup apparatus.
Figure 5:
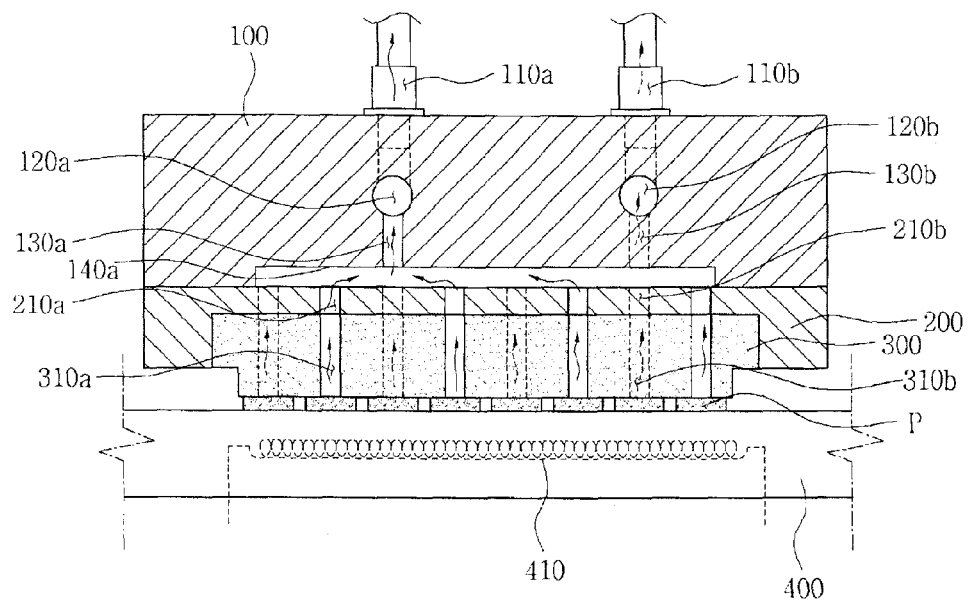
FIGS. 5 and 8 are sectional views taken along line C-C shown in FIG. 1 for illustrating operational states of a conventional semiconductor package pickup apparatus.
Figure 6:
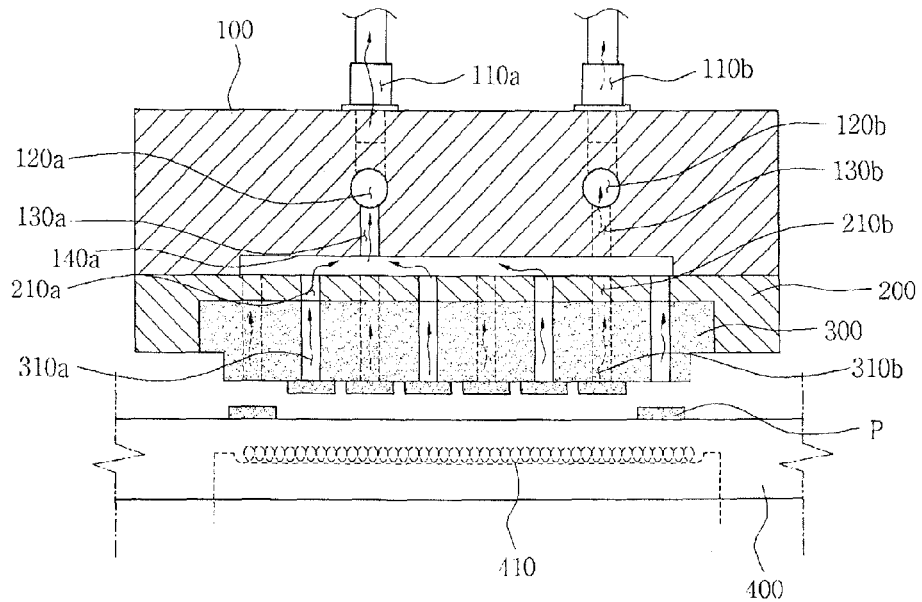
Figure 7:
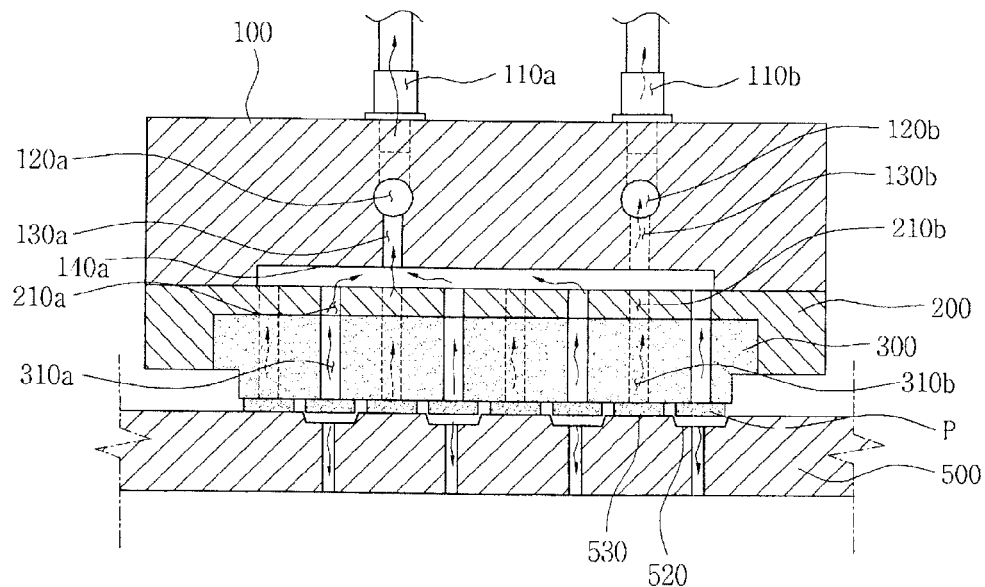
Figure 8:
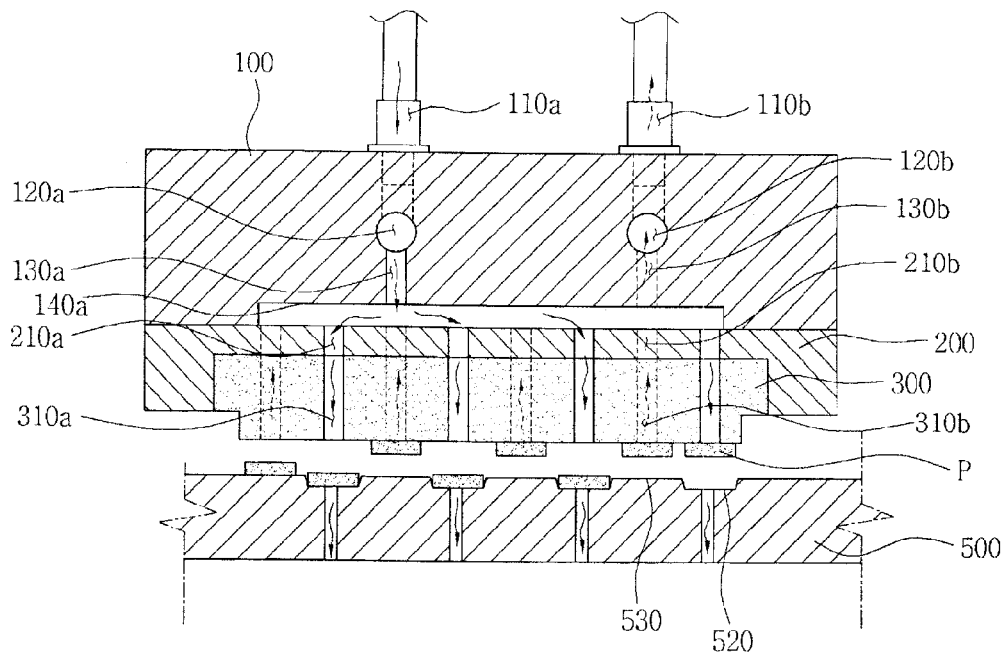

Hereinafter, a semiconductor package pickup apparatus according to the exemplary embodiment of the present invention will be described with reference to accompanying drawings.

In the following description of the present invention, a detailed description of known functions and configurations incorporated herein will be omitted when it may make the subject matter of the present invention rather unclear. In addition, terms used in the following description of the present invention are prepared in view of functions thereof, so they will be changed depending on intention of manufactures or custom. Thus, definition of the terms must be determined based on the whole content of the specification. Further, the same drawing reference numerals are used for the same elements throughout the drawings and specification. In addition, when a plurality of the same elements are provided or when elements are symmetrically aligned, the reference numeral will be assigned to only one of them. Reference character P refers to a workpiece to be processed, that is, a semiconductor package.

FIG. 9 is a perspective view illustrating a semiconductor package pickup apparatus according to an exemplary embodiment of the present invention, FIG. 10 is a partially enlarged view illustrating distribution grooves and transfer holes formed in the semiconductor package pickup apparatus shown in FIG. 9, FIG. 11 is a bottom view illustrating a picker base of the semiconductor package pickup apparatus shown in FIG. 9, and FIGS. 12 and 13 are sectional views, which are taken along lines D-D and E-E shown in FIG. 11 in order to illustrate the semiconductor package pickup apparatus.

As shown in FIGS. 9 to 11, the semiconductor package pickup apparatus according to the exemplary embodiment of the present invention includes a picker base 100, a pad holder 200 and an adsorption pad 300.

The picker base 100 is formed at an inner portion thereof with a plurality of first main feeding holes 120$a$, which are aligned lengthwise along the picker base 100 and connected to a first pneumatic line 110$a$, and a plurality of second main feeding holes 120$b$, which are aligned lengthwise along the picker base 100 and connected to a second pneumatic line 110$b$. Here, the first and second main feeding holes 120$a$ are formed in a dual-layer structure, so that they are aligned in different planes and uniformly distributed at left and right end portions of the picker base 100. Accordingly, the pneumatic pressure supplied through the first and second pneumatic lines 110$a$ and 110$b$ can be uniformly fed into first and second adsorption holes 310$a$ and 310$b$ of the adsorption pad 300. In addition, as shown in FIGS. 12 and 13, the picker base 100 is formed at the inner portion thereof with a first connection hole 150$a$, which connects the first main feeding holes 120$a$ with each other, and a second connection hole 150$b$, which connects the second main feeding holes 120$b$ with each other. The first and second connection holes 150$a$ and 150$b$ are aligned perpendicularly to the first and second main feeding holes 120$a$ and 120$b$, respectively. First ends of the first and second connection holes 150$a$ and 150$b$ are sealed by means of a setscrew 152. The pneumatic pressure is transferred to the first and second main feeding holes 120$a$ and 120$b$ through the first and second pneumatic line 110$a$ and 110$b$, and then is uniformly distributed into the first and second main feeding holes 120$a$ and 120$b$ by means of the first and second connection holes 150$a$ and 150$b$.

The picker base 100 is formed at a bottom surface thereof with first and second gull-shaped distribution grooves 140$a$ and 140$b$, which are alternately aligned corresponding to the stack recesses 510$a$ and 520$a$ formed in a package stacker 500. Since the first and second distribution grooves 140$a$ and 140$b$ have a gull shape, the pneumatic pressure can be sequentially fed into the stack recesses 510$a$ and 520$a$, which are formed at stack sections 510 and 520 of the package stacker 500 alternately with margin cavities 510$b$ and 520$b$.

In addition, a first transfer hole 130$a$ is formed in order to connect the first main feeding hole 120$a$ with a first distribution groove 140$a$ and a second transfer hole 130$b$ is formed in order to connect the second main feeding hole 120*b* with a second distribution groove 140*b*. When viewed in a plan view, the first and second main feeding holes 120*a* and 120*b* are alternately aligned such that the first and second transfer holes 130*a* and 130*b* may not interfere with each other. Thus, it is possible to enlarge the diameter of the first and second main feeding holes 120*a* and 120*b* even if the size of the semiconductor package becomes reduced. In addition, both end portions of the first and second main feeding holes 120*a* and 120*b* are sealed by means of setscrews 122.

Meanwhile, although the present invention provides four first and second pneumatic lines 110*a* and 110*b* such that the first and second pneumatic lines 110*a* and 110*b* divide the first and second main feeding holes 120*a* and 120*b* into three sections, the number and position of the first and second pneumatic lines 110*a* and 110*b* can be changed according to embodiments of the present invention. For instance, the first and second pneumatic lines 110*a* and 110*b* can be coupled to positions where the setscrews 122 are coupled to the first and second main feeding holes 120*a* and 120*b*.

The pad holder 200 is fixed to the bottom surface of the picker base 100 in order to support the adsorption pad 300. The pad holder 200 is formed with first and second perforation holes 210*a* and 210*b* connected to the first and second distribution grooves 140*a* and 140*b*, respectively.

The adsorption pad 300 is an element for directly absorbing the semiconductor packages and is formed with first and second adsorption holes 310*a* and 310*b*, which are connected to the first and second perforation holes 210*a* and 210*b*, respectively. The first and second adsorption holes 310*a* and 310*b* are aligned corresponding to the stack recesses 510*a* and 520*a* of the package stacker 500. In addition, the adsorption pad 300 is generally made from rubber or sponge in order to protect the semiconductor packages while enhancing the adsorption force relative to the semiconductor packages.

In addition, the pneumatic pressure is controlled such that the pneumatic pressure can be separately fed into the first and second main feeding holes 120*a* and 120*b*.

Hereinafter, the operation of the semiconductor package pickup apparatus according to the exemplary embodiment of the present invention will be described with reference to accompanying drawings.

FIGS. 14 and 15 are sectional views taken along line F-F shown in FIG. 11 for illustrating operational states of the semiconductor package pickup apparatus according to the present invention when the semiconductor package pickup apparatus picks up semiconductor packages P stacked on a driving device 400, and FIGS. 16 and 17 are sectional views taken along line F-F shown in FIG. 11 for illustrating operational states of the semiconductor package pickup apparatus according to the present invention when the semiconductor package pickup apparatus loads the semiconductor packages P on the first or second stack section 510 or 520 of the package stacker 500.

As shown in FIGS. 14 and 15, when the semiconductor package pickup apparatus picks up the semiconductor packages P stacked on the driving device 400, a vacuum pressure is supplied into the first and second main feeding holes 120*a* and 120*b* through the first and second pneumatic lines 110*a* and 110*b*, so that the adsorption pad 300 picks up the semiconductor packages P stacked on the driving device 400. That is, the vacuum pressure supplied through the first pneumatic line 110*a* is applied to upper surfaces of the semiconductor packages P by way of the first main feeding hole 120*a*, the first transfer hole 130*a*, the first distribution groove 140*a*, the first perforation hole 210*a*, and the first adsorption hole 310*a*, so that the semiconductor packages P are adsorbed to the adsorption pad 300. In addition, the vacuum pressure supplied through the second pneumatic line 110*b* is applied to upper surfaces of the semiconductor packages P by way of the second main feeding hole 120*b*, the second transfer hole 130*b*, the second distribution groove 140*b*, the second perforation hole 210*b*, and the second adsorption hole 310*b*, so that the semiconductor packages P are adsorbed to the adsorption pad 300. Reference numeral 410 represents a heating wire.

As shown in FIGS. 16 and 17, when the semiconductor package pickup apparatus loads the semiconductor packages P on the first stack recess 510*a* of the package stacker 500, the pneumatic pressure is fed into the first main feeding hole 120*a* through the first pneumatic line 110*a* while continuously feeding the vacuum pressure through the second main feeding hole 120*b*, thereby loading the semiconductor packages P, which have been adsorbed to the first adsorption hole 310*a*, onto the first stack recess 510*a* of the package stacker 500. That is, the vacuum pressure supplied through the second pneumatic line 110*b* is applied to upper surfaces of the semiconductor packages P by way of the second main feeding hole 120*b*, the second transfer hole 130*b*, the second distribution groove 140*b*, the second perforation hole 210*b*, and the second adsorption hole 310*b*, so that the semiconductor packages P are adsorbed to the adsorption pad 300. In addition, the pneumatic pressure supplied through the first pneumatic line 110*a* is applied to upper surfaces of the semiconductor packages P by way of the first main feeding hole 120*a*, the first transfer hole 130*a*, the first distribution groove 140*a*, the first perforation hole 210*a*, and the first adsorption hole 310*a*, so that the semiconductor packages P are loaded onto the first stack recess 510*a* of the package stacker 500 while being released from the adsorption pad 300. Meanwhile, when the semiconductor packages P are stacked on the second stack recess 520*a* of the package stacker 500, pressure is not fed into first pneumatic line 110*a* and the pneumatic pressure is fed into the second pneumatic line 110*b*, so that the semiconductor packages P, which are adsorbed to the second adsorption hole 310*b* due to the vacuum pressure applied thereto through the second main feeding hole 120*b*, are stacked on the second stack recess 520*a* of the package stacker 500.

In this manner, according to the present invention, since the first and second main feeding holes 120*a* and 120*b* are formed in a dual-layer structure, it is possible to enlarge the diameter of the first and second main feeding holes 120*a* and 120*b* even if the size of the semiconductor package becomes reduced. In addition, since a plurality of first and second main feeding holes 120*a* and 120*b* and first and second transfer holes 130*a* and 130*b* are uniformly distributed on each plane of the picker base 100, the pneumatic pressure can be uniformly transferred to the adsorption holes 310*a* and 310*b* formed at left and right end portions of the adsorption pad 300. Accordingly, the semiconductor package pickup apparatus can precisely pick up or load the semiconductor packages even if the semiconductor package has a relatively small size.

Hereinafter, a semiconductor package pickup apparatus according to a second embodiment of the present invention will be described.

FIG. 18 shows a picker base of the semiconductor package pickup apparatus according to the second embodiment of the present invention.

As shown in FIG. 18, the semiconductor package pickup apparatus according to the second embodiment of the present invention is different from the semiconductor package pickup apparatus according to the first embodiment of the present invention in view of the number and position of the first and second main feeding holes 120*a* and 120*b* and the first and second connection holes 150*a* and 150*b*. That is, the first and second main feeding holes 120a and 120b are formed at both sides of the picker base 100 and a plurality of first and second connection holes 150a and 150b are connected to the first and second distribution grooves 140a and 140b, respectively, in such a manner that the first main feeding holes 120a are connected to each other through the first connection holes 150a and the second main feeding holes 120b are connected to each other through the second connection holes 150b. The structure and functions of other elements are identical to those of the first embodiment of the present invention. According to the second embodiment of the present invention, since fabrication work for the first and second main feeding holes 120a and 120b is more difficult than that of the first and second connection holes 150a and 150b, the fabrication steps for the first and second main feeding holes 120a and 120b are minimized.

Meanwhile, although FIG. 18 illustrates the first and second pneumatic lines 110a and 110b coupled to the first and second main feeding holes 120a and 120b, the first and second pneumatic lines 110a and 110b can be connected to the first and second connection holes 150a and 150b or can be coupled to positions where the setscrews 152 are coupled to the first and second connection holes 150a and 150b according to embodiments of the present invention.

Hereinafter, a semiconductor package pickup apparatus according to a third embodiment of the present invention will be described. FIG. 19 is a perspective view illustrating the semiconductor package pickup apparatus according to the third embodiment of the present invention, FIGS. 20 and 21 are partially enlarged views illustrating first and second distribution grooves formed in the semiconductor package pickup apparatus shown in FIG. 19, and FIG. 22 is a sectional view illustrating the coupling state of the semiconductor package pickup apparatus shown in FIG. 19.

As shown in FIGS. 19 to 22, the semiconductor package pickup apparatus according to the third embodiment of the present invention is different from the semiconductor package pickup apparatus according to the first embodiment of the present invention in view of the structure of the picker base 100. That is, the picker base 100 of the semiconductor package pickup apparatus according to the third embodiment of the present invention includes an upper base 100a and a lower base 100b.

A plurality of first main feeding holes 120a, which are connected to the first pneumatic line 110a, are formed at an inner portion of the upper base 100a lengthwise along the upper base 100a. Here, the first main feeding holes 120a are uniformly distributed. In addition, the upper base 100a is formed at the inner portion thereof with a first connection hole 150a, which is aligned perpendicularly to the first main feeding holes 120a in order to connect the first main feeding holes 120a to each other. One end of the first connection hole 150a is sealed by means of a setscrew 152. The pneumatic pressure is transferred to the first main feeding hole 120a through the first pneumatic line 110a, and then is uniformly distributed into the first main feeding holes 120a by means of the first connection hole 150a. In addition, a plurality of first gull-shaped distribution grooves 140a are formed in the bottom surface of the upper base 100a corresponding to one of the stack recesses 510a and 520a formed in the package stacker 500. A plurality of transfer holes 130 are formed in order to connect the first main feeding holes 120a to the first distribution grooves 140a.

In addition, a plurality of second main feeding holes 120b, which are connected to the second pneumatic line 110b, are formed at an inner portion of the lower base 100b lengthwise along the lower base 100b. Here, the second main feeding holes 120a are uniformly distributed. In addition, the lower base 100b is formed at the inner portion thereof with a second connection hole 150b, which is aligned perpendicularly to the second main feeding holes 120b in order to connect the second main feeding holes 120b to each other. One end of the second connection hole 150b is sealed by means of a setscrew 152. The pneumatic pressure is transferred to the second main feeding hole 120b through the second pneumatic line 110b, and then is uniformly distributed into the second main feeding holes 120b by means of the second connection hole 150b. A plurality of second gull-shaped distribution grooves 140b are formed in the bottom surface of the lower base 100b corresponding to one of the stack recesses 510a and 520a formed in the package stacker 500. In addition, a plurality of transfer holes 130 are formed between the second main feeding holes 120b and the second distribution grooves 140b and a plurality of third transfer holes 160 are formed between the second distribution grooves 140b such that they are connected to the first distribution grooves 140a. At this time, the second distribution grooves 140b are formed in the lower base 100b, so that the second distribution grooves 140b are not overlapped with the first distribution grooves 140a.

When viewed in a plan view, the first and second main feeding holes 120a and 120b are alternately aligned so that the first and second transfer holes 130a and 130b may not interfere with each other.

In the semiconductor package pickup apparatus according to the third embodiment of the present invention, the pneumatic pressure supplied through the first pneumatic line 110a is transferred to the first adsorption hole 310a of the adsorption pad 300 by way of the first main feeding hole 120a, the first transfer hole 130a, the first distribution groove 140a, and the third transfer hole 160. In addition, the pneumatic pressure supplied through the second pneumatic line 110b is transferred to the second adsorption hole 310b of the adsorption pad 300 by way of the second main feeding hole 120b, the second transfer hole 130b, and the second distribution groove 140b. Similar to the first embodiment of the present invention, the pneumatic pressure fed into the first and second main feeding holes 120a and 120b is independently controlled. That is, the operation of the semiconductor package pickup apparatus according to the third embodiment of the present invention is similar to that of the first embodiment of the present invention.

The semiconductor package pickup apparatus according to the third embodiment of the present invention is preferably used when the first and second distribution grooves 140a and 140b cannot be formed in one picker base 100 due to size-reduction of the semiconductor package. That is, if the first and second distribution grooves 140a and 140b are formed in upper and lower bases, respectively, by dividing the picker base 100 into upper and lower bases, the first distribution grooves 140a can be prevented from being overlapped with the second distribution grooves 140b.

Figure 25:
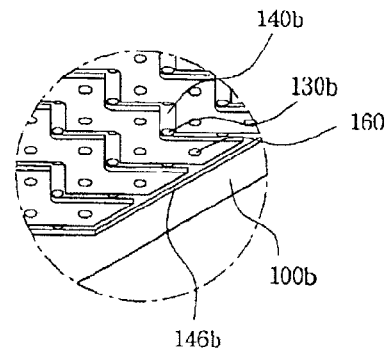

Hereinafter, a semiconductor package pickup apparatus according to a fourth embodiment of the present invention will be described. FIG. 23 is a perspective view illustrating the semiconductor package pickup apparatus according to the fourth embodiment of the present invention, and FIGS. 24 and 25 are partially enlarged views illustrating first and second distribution grooves formed in the semiconductor package pickup apparatus shown in FIG. 23.

As shown in FIG. 23, the semiconductor package pickup apparatus according to the fourth embodiment of the present invention is substantially identical to that of the third embodiment of the present invention, except that the semiconductor package pickup apparatus according to the fourth embodiment of the present invention further includes first and second connection grooves 146a and 146b, which are used for connecting both end portions of the first and second distribution grooves 140a and 140b, respectively.

If the both end portions of the first and second distribution grooves 140a and 140b are connected to each other by means of the first and second connection grooves 146a and 146b, the pneumatic pressure supplied through the first and second pneumatic lines 110a and 110b can be more uniformly distributed.

Hereinafter, a semiconductor package pickup apparatus according to a fifth embodiment of the present invention will be described.

Figure 26:
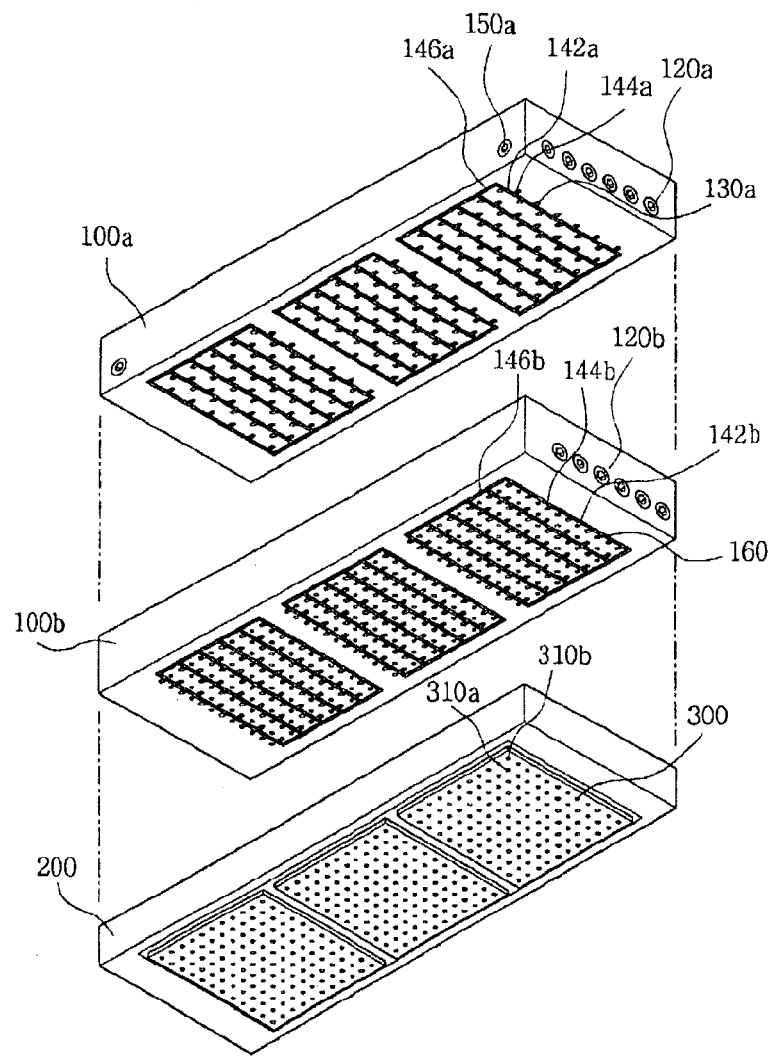
FIG. 26 is a perspective view illustrating a semiconductor package pickup apparatus according to a fifth embodiment of the present invention.

FIG. 26 is a perspective view illustrating the semiconductor package pickup apparatus according to the fifth embodiment of the present invention, FIGS. 27 and 28 are partially enlarged views illustrating first and second distribution grooves formed in the semiconductor package pickup apparatus shown in FIG. 26, and FIGS. 29 and 30 are bottom views illustrating upper and lower bases of the semiconductor package pickup apparatus shown in FIG. 26.

As shown in FIG. 26, the semiconductor package pickup apparatus according to the fifth embodiment of the present invention is different from the semiconductor package pickup apparatus according to the fourth embodiment of the present invention in view of the shape of the first and second distribution grooves 140a and 140b. That is, different from the fourth embodiment of the present invention, which provides the gull-shaped first and second distribution grooves 140a and 140b aligned corresponding to the stack recesses 510a and 520a and the margin cavities 510b and 520b formed in the package stacker 500, the fifth embodiment of the present invention provides first and second distribution grooves 140a and 140b, which include first and second main distribution grooves 142a and 142b, which are linearly formed in the upper and lower bases 100a and 100b widthwise along the upper and lower bases 100a and 100b, first and second auxiliary distribution grooves 144a and 144b, which alternately protrude up and down from the first and second main distribution grooves 142a and 142b at a pre-determined interval, and first and second connection grooves 146a and 146b for connecting both end portions of the first and second main distribution grooves 142a and 142b, respectively. In addition, first and second transfer holes 130a and 130b are formed in the first and second auxiliary distribution grooves 144a and 144b and third transfer holes 160 are formed between the first and second main distribution grooves 142a and 142b while being connected to the first transfer holes 130a.

According to the fifth embodiment of the present invention, it is possible to easily form the first and second distribution grooves 140a and 140b.

Hereinafter, a semiconductor package pickup apparatus according to a sixth embodiment of the present invention will be described.

FIG. 31 is a perspective view illustrating the semiconductor package pickup apparatus according to the sixth embodiment of the present invention, and FIG. 32 is a sectional view illustrating the coupling state of the semiconductor package pickup apparatus shown in FIG. 31.

As shown in FIGS. 31 and 32, the semiconductor package pickup apparatus according to the sixth embodiment of the present invention is different from the semiconductor package pickup apparatus according to the first embodiment of the present invention in view of the structure of the picker base 100. That is, the picker base 100 of the semiconductor package pickup apparatus according to the sixth embodiment of the present invention includes an upper base 100a and a lower base 100b.

The upper base 100a is formed at an inner portion thereof with first main feeding holes 120a connected to the first pneumatic line 110a. In addition, a plurality of vacuum pipes 170, which are connected to the first main feeding holes 120a, may protrude from the bottom surface of the upper base 100a. The vacuum pipes 170 are aligned corresponding to the first adsorption holes 310a of the adsorption pad 300.

The lower base 100b is formed at an inner portion thereof with second main feeding holes 120b connected to the second pneumatic line 110b. In addition, pipe holes 180 for receiving the vacuum pipes 170 and transfer holes 130 connected to the second main feeding holes 120b are alternately formed in the inner portion of the lower base 100b. Here, the vacuum pipes 170 are connected to first perforation holes 210a of the pad holder 200 and the transfer holes 130 are connected to second perforation holes 210b of the pad holder 200.

In the semiconductor package pickup apparatus according to the sixth embodiment of the present invention, the pneumatic pressure supplied through the first pneumatic line 110a is transferred to the semiconductor packages by way of the first main feeding hole 120a, the pipe hole 180, the first perforation hole 210a, and the first adsorption hole 310a. In addition, the pneumatic pressure supplied through the second pneumatic line 110b is transferred to the semiconductor packages by way of the second main feeding hole 120b, the transfer hole 130, the second perforation hole 210b, and the second adsorption hole 310b.

Hereinafter, a semiconductor package pickup apparatus according to a seventh embodiment of the present invention will be described.

FIG. 33 is a partially enlarged view illustrating first and second distribution grooves formed in the semiconductor package pickup apparatus according to the seventh embodiment of the present invention, and FIG. 34 is a partially enlarged view illustrating alignment between first transfer holes and first main feeding holes formed in first distribution grooves shown in FIG. 33.

As shown in FIGS. 33 and 34, the semiconductor package pickup apparatus according to the seventh embodiment of the present invention includes a plurality of first and second transfer holes 130a and 130b, which connect first and second main feeding holes 120a and 120b with first and second distribution grooves 140a and 140b, respectively. That is, since the width of the first and second distribution grooves 140a and 140b is relatively small as compared with the diameter of the first and second transfer holes 130a and 130b, a plurality of first and second transfer holes 130a and 130b are provided or the first and second transfer holes 130a and 130b are provided in the form of slits, thereby allowing the vacuum pressure or pneumatic pressure to be easily transferred to the first and second distribution grooves 140a and 140b from the first and second main feeding holes 120a and 120b.

According to the seventh embodiment of the present invention, air can be more easily transferred to the first and second distribution grooves 140a and 140b, so that it is possible to reduce the size of the first and second main feeding holes 120a and 120b.

Meanwhile, although the seventh embodiment of the present invention provides three first and second transfer holes 130a and 130b in order to connect first and second main feeding holes 120a and 120b with the first distribution groove 140a or the second distribution groove 140b, it is also possible to provide two or four transfer holes 130a and 130b within the diameter range of the first and second main feeding holes 120*a* and 120*b*. In addition, the technical principle disclosed in the seventh embodiment of the present invention can also be applied to the first to sixth embodiments of the present invention.

Although it is not illustrated in the drawings, a sealing member can be provided between the upper and lower bases 100*a* and 100*b* or between the lower base 100*b* and the pad holder 200 in order to prevent air from being leaked. In addition, the number and position of the pneumatic lines 110*a* and 110*b* may be changed according to the embodiments of the present invention.

Although a preferred embodiment of the present invention has been described for illustrative purposes, those skilled in the art will appreciate that various modifications, additions and substitutions are possible, without departing from the scope and spirit of the invention as disclosed in the accompanying claims. For instance, although the present invention has been described in relation to the semiconductor packages for illustrative purposes, and the present invention is also applicable for various semiconductor products or half-finished semiconductor products. In addition, although the present invention discloses that the semiconductor packages are loaded onto the package stacker or picked up from the package stacker after the drying process has been completed, the present invention is not limited thereto, but includes the semiconductor package pickup apparatus incorporating with other processes or package stackers having a modified structure.

As can be seen from the foregoing, the semiconductor package pickup apparatus according to the present invention has a structure capable of providing a high vacuum, so the semiconductor package pickup apparatus can easily pick up or load the semiconductor packages onto the package stacker even if the semiconductor packages have a small size. Accordingly, the semiconductor package pickup apparatus according to the present invention can be effectively used when it is necessary to process the semiconductor packages having a small size.

The invention claimed is:

1. An apparatus for picking up semiconductor packages comprising:
   a picker base having a first main feeding hole connected to a first pneumatic line and a plurality of first transfer holes, and a second main feeding hole connected to a second pneumatic line and a plurality of second transfer holes, the first and second pneumatic lines providing a pneumatic pressure, and
   an adsorption pad coupled to a lower portion of the picker base and formed with adsorption holes connected to the first and second main feeding holes through the plurality of first and second transfer holes, wherein each of the absorption holes is configured to pick up one of said semiconductor packages,
   the pneumatic pressure supplied into the first and second main feeding holes to be independently controlled,
   wherein the first and second main feeding holes are aligned in a dual-layer structure, wherein all the plurality of first and second transfer holes are alternately arranged in the picker base so that each of the plurality of first transfer holes is arranged next to at least one of the plurality of second transfer holes and each of the plurality of second transfer holes is arranged next to at least one of the plurality of first transfer holes,
   wherein the first and second main feeding holes include a pair of perforation holes formed lengthwise along the picker base, the picker base has a plurality of first connection holes, which are aligned perpendicularly to the first main feeding holes to connect the first main feeding holes to each other, and a plurality of second connection holes, which are aligned perpendicularly to the second main feeding holes to connect the second main feeding holes to each other, the plurality of first and second transfer holes are formed in the picker base so that the plurality of first and second transfer holes can be connected to the first and second main feeding holes, and the picker base is formed at a bottom surface thereof with first and second distribution grooves, which are alternately aligned so as to be connected to the plurality of first and second transfer holes.

2. The apparatus as claimed in claim 1, wherein a plurality of said first and second main feeding holes are uniformly distributed on a first plane and a second plane of the picker base respectively, so that the pneumatic pressure can be uniformly transferred to the adsorption holes of the adsorption pad.

3. The apparatus as claimed in claim 1, wherein first and second distribution grooves are alternately formed at a bottom surface of the picker base so as to be connected to the plurality of first and second transfer holes, and the pneumatic pressure supplied through the plurality of first and second transfer holes is transferred to the adsorption holes through the first and second distribution grooves.

4. An apparatus for picking up semiconductor packages, comprising:
   a picker base formed with first and second main feeding holes, which are connected to first and second pneumatic lines providing a pneumatic pressure and aligned in a dual-layer structure,
   an adsorption pad coupled to a lower portion of the picker base and formed with adsorption holes connected to the first and second main feeding holes,
   wherein the pneumatic pressure supplied into the first and second main feeding holes is independently controlled,
   wherein the picker base includes an upper base formed with the first main feeding hole connected to the first pneumatic line and a lower base formed with the second main feeding hole connected to the second pneumatic line, and
   wherein a plurality of first and second distribution grooves are provided while being connected to each other.

5. The apparatus as claimed in claim 4, wherein a pad holder formed with first and second perforation holes is coupled to a lower portion of the picker base, and the adsorption pad is coupled to a lower portion of the pad holder.

6. An apparatus for picking up semiconductor packages comprising:
   a picker base having a first main feeding hole connected to a first pneumatic line and a plurality of first transfer holes, and a second main feeding hole connected to a second pneumatic line and a plurality of second transfer holes, the first and second pneumatic lines providing a pneumatic pressure, and an adsorption pad coupled to a lower portion of the picker base and formed with adsorption holes connected to the first and second main feeding holes through the plurality of first and second transfer holes, wherein each of the absorption holes is configured to pick up one of said semiconductor packages, the pneumatic pressure supplied into the first and second main feeding holes to be independently controlled, wherein the first and second main feeding holes are aligned in a dual-layer structure, wherein all the plurality of first and second transfer holes are alternately arranged in the picker base so that each of the plurality of first transfer holes is arranged next to at least one of the plurality of second transfer holes and each of the plurality of second transfer holes is arranged next to at least one of the plurality of first transfer holes, wherein a plurality of said first and second main feeding holes are provided, wherein the picker base includes an upper base having the plurality of said first main feeding holes therein and a lower base having the plurality of said second main feeding holes therein, wherein the upper base is formed at an inner portion thereof with a first connection hole, which is aligned perpendicularly to the plurality of said first main feeding holes in order to connect the plurality of said first main feeding holes to each other, and the lower base is formed at an inner portion thereof with a second connection hole, which is aligned perpendicularly to the plurality of said second main feeding holes in order to connect the plurality of said second main feeding holes to each other.

7. An apparatus for picking up semiconductor packages comprising:

an upper base having a first main feeding hole connected to a first pneumatic line and being provided with a vacuum pipe, which protrudes from a bottom surface of the upper base so as to be connected to the first main feeding hole;

a lower base coupled to the bottom surface of the upper base, formed with a second main feeding hole connected to a second pneumatic line, and formed at an inner portion thereof with a pipe hole for receiving the vacuum pipe and a transfer hole connected to the second main feeding hole; and an adsorption pad coupled to a lower portion of the lower base and formed with adsorption holes connected to the first and second main feeding holes, wherein the pneumatic pressure supplied into the first and second main feeding holes is independently controlled.

8. An apparatus for picking up semiconductor packages comprising:

a picker base having a first main feeding hole connected to a first pneumatic line and a plurality of first transfer holes, and a second main feeding hole connected to a second pneumatic line and a plurality of second transfer holes, the first and second pneumatic lines providing a pneumatic pressure, and an adsorption pad coupled to a lower portion of the picker base and formed with adsorption holes connected to the first and second main feeding holes through the plurality of first and second transfer holes, wherein each of the absorption holes is configured to pick up one of said semiconductor packages, the pneumatic pressure supplied into the first and second main feeding holes to be independently controlled, wherein the first and second main feeding holes are aligned in a dual-layer structure, wherein all the plurality of first and second transfer holes are alternately arranged in the picker base so that each of the plurality of first transfer holes is arranged next to at least one of the plurality of second transfer holes and each of the plurality of second transfer holes is arranged next to at least one of the plurality of first transfer holes, wherein the picker base includes an upper base having the first main feeding hole therein and a lower base having the second main feeding hole therein, wherein the upper base is formed at an inner portion thereof with the plurality of first transfer holes connected to the first main feeding hole, a first distribution groove is formed at a bottom surface of the upper base to be connected to the plurality of first transfer holes, the lower base is formed at an inner portion thereof with the plurality of second transfer holes connected to the second main feeding hole, and a second distribution groove and a third transfer hole are formed at a bottom surface of the lower base such that the second distribution groove and the third transfer hole can be connected to the plurality of second transfer holes and the first distribution groove, respectively.

\* \* \* \* \*